(12) United States Patent
Zerbe et al.

(10) Patent No.: US 7,072,415 B2
(45) Date of Patent: Jul. 4, 2006

(54) METHOD AND APPARATUS FOR GENERATING MULTI-LEVEL REFERENCE VOLTAGE IN SYSTEMS USING EQUALIZATION OR CROSSTALK CANCELLATION

(75) Inventors: Jared Zerbe, Woodside, CA (US); Carl Werner, Los Gatos, CA (US)

(73) Assignee: Rambus Inc., Los Altos, CA (US)

( * ) Notice: Subject to any disclaimer, the term of this patent is extended or adjusted under 35 U.S.C. 154(b) by 791 days.

(21) Appl. No.: 09/964,911

(22) Filed: Sep. 27, 2001

(65) Prior Publication Data

US 2002/0075968 A1 Jun. 20, 2002

Related U.S. Application Data

(63) Continuation-in-part of application No. 09/655,010, filed on Sep. 5, 2000, now Pat. No. 6,772,351, and a continuation-in-part of application No. 09/654,643, filed on Sep. 5, 2000.

(60) Provisional application No. 60/158,189, filed on Oct. 19, 1999.

(51) Int. Cl.
*H04L 25/34* (2006.01)
*H04L 25/49* (2006.01)

(52) U.S. Cl. ............... 375/286; 375/353

(58) Field of Classification Search ............... 375/286, 375/287, 242, 353, 292; 326/60, 62, 63, 326/86, 90, 80, 82; 713/300
See application file for complete search history.

(56) References Cited

U.S. PATENT DOCUMENTS

| | | | | |
|---|---|---|---|---|
| 2,732,431 A | * | 1/1956 | Boughtwood | 370/201 |
| 3,381,245 A | * | 4/1968 | Guanella | 333/20 |
| 3,723,982 A | * | 3/1973 | Frazier, Jr. | 360/18 |
| 4,398,287 A | * | 8/1983 | Spencer | 370/362 |
| 4,481,625 A | | 11/1984 | Roberts et al. | 370/85 |
| 4,748,637 A | | 5/1988 | Bishop et al. | 375/7 |
| 5,254,883 A | | 10/1993 | Horowitz et al. | 307/443 |
| 5,534,795 A | | 7/1996 | Wert et al. | 326/81 |
| 5,534,798 A | | 7/1996 | Phillips et al. | 326/108 |
| 5,568,045 A | * | 10/1996 | Koazechi | 323/314 |
| 5,585,749 A | * | 12/1996 | Pace et al. | 327/108 |
| 5,604,468 A | | 2/1997 | Gillig | 331/176 |
| 5,608,755 A | | 3/1997 | Rakib | 375/219 |
| 5,663,663 A | | 9/1997 | Cao et al. | 326/81 |
| 5,751,168 A | | 5/1998 | Speed, III et al. | 326/83 |
| 5,757,712 A | | 5/1998 | Nagel et al. | 365/226 |

(Continued)

FOREIGN PATENT DOCUMENTS

WO    WO 99 10982    3/1999    ............ 19/175

*Primary Examiner*—Kevin Burd
*Assistant Examiner*—Juan Alberto Torres
(74) *Attorney, Agent, or Firm*—Silicon Edge Law Group LLP; Arthur J. Behiel

(57) ABSTRACT

A system and method are shown for generation of at least one reference voltage level in a bus system. A reference voltage generator on a current driver includes at least one reference voltage level, at least one control signal, and an active device. The active device is coupled to the at least one control signal, such as a current control signal, and a selected reference voltage of the at least one reference voltage level. The active device is arranged to shift the at least one reference voltage level based on the at least one current control signal such as an equalization signal, a crosstalk signal, or the combination thereof, employed on the current driver.

15 Claims, 16 Drawing Sheets

U.S. PATENT DOCUMENTS

| | | | |
|---|---|---|---|
| 5,798,918 A | 8/1998 | Georgiou et al. | 700/28 |
| 5,867,010 A | 2/1999 | Hinedi et al. | 323/282 |
| 5,973,508 A | 10/1999 | Nowak et al. | 326/81 |
| 5,986,472 A | 11/1999 | Hinedi et al. | 326/68 |
| 6,006,169 A | 12/1999 | Sandhu et al. | 702/132 |
| 6,097,215 A | 8/2000 | Bialas, Jr. et al. | 326/68 |
| 6,100,713 A * | 8/2000 | Kalb et al. | 326/30 |
| 6,140,841 A | 10/2000 | Suh | 326/60 |
| 6,160,421 A | 12/2000 | Barna | 326/63 |
| 6,204,785 B1 | 3/2001 | Fattaruso et al. | 341/120 |
| 6,215,635 B1 | 4/2001 | Nguyen | 361/103 |
| 6,560,293 B1 * | 5/2003 | Alelyunas et al. | 375/261 |

* cited by examiner

CIRCUIT FOR CALIBRATING THE GDS COMPENSATED
OUTPUT DRIVER WITH CURRENT CONTROL

METHOD FOR CALIBRATING THE GDS COMPENSATED OUTPUT DRIVER WITH CURRENT CONTROL

METHOD FOR CALIBRATING THE GDS COMPENSATED OUTPUT DRIVER WITH CURRENT CONTROL

METHOD AND APPARATUS FOR GENERATING MULTI-LEVEL REFERENCE VOLTAGE IN SYSTEMS USING EQUALIZATION OR CROSSTALK CANCELLATION

CROSS REFERENCE TO RELATED APPLICATION(S)

This application is a continuation-in-part of U.S. patent application Ser. No. 09/654,643, entitled "Low Latency Equalization in Multi-Level, Multi-Line Communication Systems," filed Sep. 5, 2000, and, is continuation-in-part of U.S. patent application Ser. No. 09/655,010, entitled "Method and Apparatus for Calibrating a Multi-Level Current Mode Driver," filed on Sep. 5, 2000, now U.S. Pat. No. 6,772,351 which claims priority to U.S. Provisional Patent Application Ser. No. 60/158,189, entitled "A Method and Apparatus for Receiving High Speed Signals with Low Latency," filed on Oct. 19, 1999, the contents of each of which are incorporated herein by reference. Further, this application claims priority to a PCT Application No. PCT/US01/27478, entitled "Method and Apparatus for Calibrating a Multi-Level Current Mode Driver and for Generating a Multi-Level Reference Voltage in Systems Using Equalization or Crosstalk Cancellation," filed on Sep. 5, 2001, the contents of which are incorporated herein by reference. Additionally, the application incorporates in its entirety, U.S. patent application Ser. No. 09/478,916, entitled "Low Latency Multi-Level Communication Interface," which claims priority to the U.S. Provisional Patent Application Ser. No. 60/158,189, entitled "A Method and Apparatus for Receiving High Speed Signals with Low Latency."

FIELD OF THE INVENTION

The present invention relates generally to the field of electrical buses. More particularly, the present invention relates to a reference voltage generation for an electrical bus with equalization or crosstalk.

BACKGROUND OF THE INVENTION

Computer systems and other electronic systems typically use buses for interconnecting integrated circuit components so that the components may communicate with one another. The buses frequently connect a master, such as a microprocessor or controller, to slaves, such as memories and bus transceivers. Generally, a master may send data to and receive data from one or more slaves. A slave may send data to and receive data from a master, but not another slave.

Each master and slave coupled to a prior bus typically includes output driver circuitry for driving signals onto the bus. Some prior bus systems have output drivers that use transistor-transistor logic ("TTL") circuitry. Other prior bus systems have output drivers that include emitter-coupled logic ("ECL") circuitry. Other output drivers use complementary metal-oxide-semiconductor ("CMOS") circuitry or N-channel metal-oxide-semiconductor ("NMOS") circuitry.

While many prior buses were driven by voltage level signals, it has become advantageous to provide buses that are driven by a current mode output driver. A benefit associated with a current mode driver is a reduction of peak switching current. In particular, the current mode driver draws a known current regardless of load and operating conditions. A further benefit is that the current mode driver typically suppresses noise coupled from power and ground supplies.

A known current mode driver is shown in U.S. Pat. No. 5,254,883 (the "'883 patent"), which is assigned to the assignee of the present invention and incorporated herein by reference. The '883 patent discusses an apparatus and method for setting and maintaining the operating current of a current mode driver. The driver in the '883 patent includes an output transistor array, output logic circuitry coupled to the transistor array and a current controller coupled to the output logic circuitry.

For one embodiment, the current controller in the '883 patent is a resistor reference current controller. The current controller receives two input voltages, $V_{TERM}$ and $V_{REF}$, the latter of which is applied to an input of a comparator. $V_{TERM}$ is coupled by a resistor to a node, which is in turn coupled to a second input of the comparator. The voltage at the node is controlled by a transistor array, which is in turn controlled in accordance with an output of the comparator.

When the transistor array is placed in the "off" state, i.e. there is no current flowing through the transistors of the array to ground, the voltage at the node is equal to $V_{TERM}$. In addition, by using the output of the comparator to adjustably activate the transistor array, the '883 patent shows that the voltage at the node may be driven to be approximately equal to the reference voltage, $V_{REF}$.

Knowing the value of $V_{REF}$ and $V_{TERM}$, the current mode driver of the '883 patent therefore provides a binary signaling scheme utilizing a symmetrical voltage swing about $V_{REF}$. Specifically, in a first current state (the "off" state), the current mode driver is not sinking current and the signal line (or bus line) is at a voltage, $V_0 = V_{TERM}$, representing a logical "0." In a second current state (the "on" state), the current mode driver is sinking current to drive the voltage on the signal line (or bus line) to be:

$$V_0 = V_{TERM} - 2(V_{TERM} - V_{REF}).$$

The second state therefore representing a logical "1."

While the binary signal levels are commonly used, the use of multi-level signals is a known technique for increasing the data rate of a digital signaling system. Such multi-level signaling is sometimes known as multiple pulse amplitude modulation or multi-PAM, and has been implemented with radio or other long-distance wireless signaling systems. Other long-distance uses for multi-PAM signaling include computer or telecommunication systems that employ Gigabit Ethernet over optical fiber and over copper wires, which use three and five signal levels, respectively.

Additionally, multi-PAM signaling may be used for communication between devices in close proximity or belonging to the same system, such as those connected to the same integrated circuit ("IC") or printed circuit board ("PCB"). In such systems, the characteristics of transmission lines, such as buses or transmission lines, over which the signals travel are tightly controlled, so that the increase in the data rate may be increased by increasing the transmit frequency. However, at higher frequencies, receiving devices may have a reduced ability to distinguish binary signals. Further, for cases in which attenuation of a signal exists between transmission and reception, different amounts of signal loss may occur depending upon the magnitude of transition between logic states. To compensate for the attenuation of the received signal, different equalization signals may be added to the main signal when driving different transitions in order to add predetermined high-frequency components to the transition signals that raise the slope of the edge of the transition. However, a difficulty with this approach for a typical multi-PAM system is that the voltage can only be pulled down from the $V_{TERM}$, unless negative current could flow through current sources. To allow overdriving a transition with the equalization signals, the highest logic state may, therefore, be reduced below $V_{TERM}$. This may cause the respective reference voltages to be no longer centered on the shifted data eyes.

Further, in a system that has numerous closely spaced signal lines, such as a bus for a computer device or a similar device, crosstalk may exist between nearby lines. As is known in the art, crosstalk is a disturbance caused by the electric or magnetic fields of one telecommunication signal and impairs signals on adjacent signal lines. Crosstalk characteristics on a bus may be based upon how many lines are between a crosstalk creator and a signal line being affected by crosstalk. One method for crosstalk cancellation has been described in the co-pending U.S. patent application entitled "Low Latency Equalization in Multi-Level, Multi-Line Communication Systems," identified above. Similarly to the equalization mechanism, the crosstalk cancellation provides high frequency component signal and, thus, the highest logic state of the system is typically reduced below $V_{TERM}$, causing reference voltage levels to be no longer centered on the shifted data eyes.

Thus, it is still desirable to develop a method and system for reference voltage generation that would track the logic state shifts due to equalization or crosstalk.

SUMMARY OF THE INVENTION

A multi-level driver uses multiple pulse amplitude modulation (multi-PAM) output drivers to send multi-PAM signals. A multi-PAM signal has two or more voltage levels, with each data interval now transmitting a "symbol" at one of the valid voltage levels. In one embodiment, a symbol represents two or more bits. The multi-PAM output driver drives an output symbol on a signal line. The output symbol preferably represents at least two bits that include a most significant bit (MSB) and a least significant bit (LSB). A multi-PAM receiver receives the output symbol from the signal line and determines the MSB and the LSB.

In accordance with one aspect of the invention, a reference voltage generator for a driver, such as a current driver, is provided. The current driver includes at least one reference voltage level, at least one current control signal, and at least one active device coupled to a selected reference voltage level of the at least one reference voltage level and the at least one current control signal. The active device shifts the at least one reference voltage level based on the at least one current control signal such as an equalization signal or a crosstalk cancellation signal. In one embodiment, the current driver is arranged to operate in a 2-PAM mode, a 4-PAM mode, or an N-PAM mode.

In accordance with another aspect of the invention, a method for generating a plurality of reference voltage levels for a driver is provided. The method includes providing at least one reference voltage level, providing at least one current control signal, and adjusting the at least one reference voltage level based on the at least one current control signal. In one embodiment, the at least one reference voltage level is generated on a resistive voltage divider or a reference voltage driver. Further, the at least one current control signal may include, for example, an equalization current control signal or a crosstalk cancellation signal.

These as well as other aspects and advantages of the present invention will become more apparent to those of ordinary skill in the art by reading the following detailed description, with reference to the accompanying drawings.

BRIEF DESCRIPTION OF THE DRAWINGS

Exemplary embodiments of the present invention are described with reference to the following drawings, in which.

DETAILED DESCRIPTION OF THE PREFERRED EMBODIMENT(S)

Figure 1:
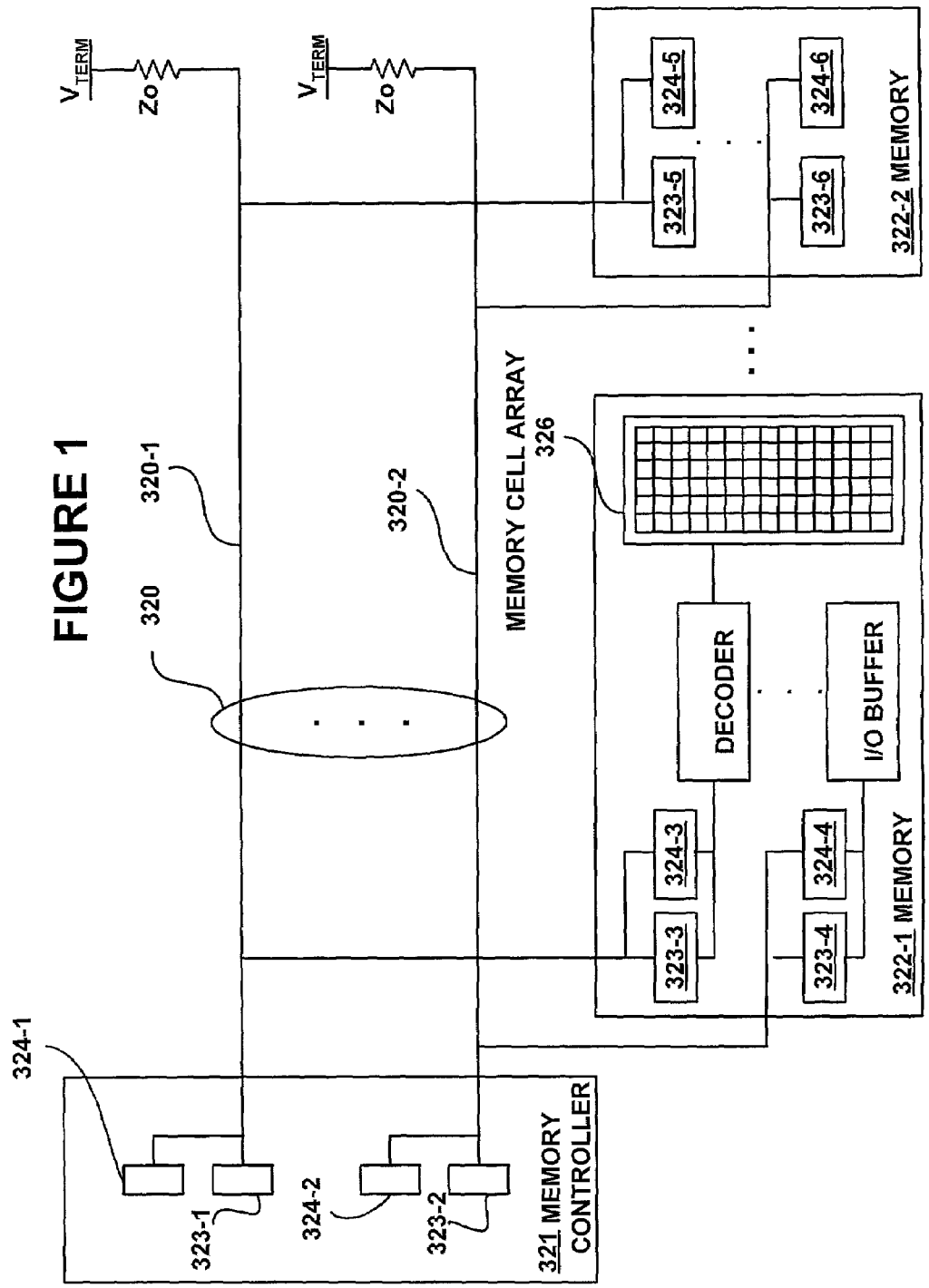
FIG. 1 is a block diagram of a memory controller, bus and memories utilizing an output driver in accordance with a preferred embodiment of the present invention.

In FIG. 1, a bus 320 interconnects a memory controller 321 and memories 322. The bus 302 is formed of signal lines 320-1, 320-2 that transmit address, data and control signals. Physically, on each integrated circuit 321, 322, the address, data and control signals are supplied to and output from external connections, called pins, and the bus 320 interconnects respective pins. The bus 320 may be implemented as traces on a printed circuit board, wires or cables and connectors. Each of these integrated circuits 321, 322 has bus output driver circuits 323 that connect to the pins to interface with the bus 320 to transmit signals to other ones of the integrated circuits. In particular, the bus output drivers 323 in the memory controller 321 and in the memories 322 transmit data over the bus 320. Each bus output driver 323 drives a signal line of the bus 320. For example, bus output driver 323-1 in the memory controller 321 drives bus line 320-1. The bus 320 supports signaling with characteristics that are a function of many factors such as the system clock speed, the bus length, the amount of current that the output drivers can drive, the supply voltages, the spacing and width of the wires or traces making up the bus 320, the physical layout of the bus itself and the resistance of a terminating resistor Zo attached to each bus.

At least a subset of the signal lines connect to pull-up resistors Zo that connect to a termination voltage $V_{TERM}$. In some systems, all signal lines connect to pull-up resistors Zo, that, in turn, connect to the termination voltage $V_{TERM}$. The termination voltage $V_{TERM}$ may be different than the supply voltage $V_{DD}$ or not. The termination resistors can be off-chip or on-chip. In one embodiment, the supply voltage $V_{DD}$ is equal to 2.5 volts, the termination voltage $V_{TERM}$ is equal to 1.8 volts, the bus voltage for a signal at low levels $V_{LO}$ is equal to 1.0 volts, and the voltage swing is 0.8 volts. The resistance of the terminating resistors Zo, for this embodiment, is equal to twenty-eight ohms.

The output drivers 323 are designed to drive the bus 320 with a predetermined amount of current, and a number of bus receivers 324 are designed to receive the signals sent by the bus drivers 323 on the bus 320. In a device, each bus receiver 324 receives signals from one signal line of the bus 320. The bus receivers 324 are integrating receivers according to the preferred embodiments.

In one embodiment, the memories are random access memories (RAMs). In an alternative embodiment, the memories are read-only memories (ROMs). Alternatively, the bus output drivers 323 and bus receivers 324 of the present invention are implemented in other semiconductor devices that use a bus to interconnect various types of integrated circuits such as microprocessors and disk controllers.

In another alternative embodiment, the output drivers are implemented in a point-to-point system rather than a bus system. Although a bus that uses current mode signaling has been described with respect to FIG. 1, the apparatus and method of the present invention may be used in any signaling system where it is desirable to distinguish between signals having different voltage levels.

Referring back to FIG. 1, in previously known implementations of the bus system, signals transmitted on each signal line of the bus have either of two voltage levels representing a binary zero or one for binary digital communication. For example, an output voltage equal to the voltage level $V_{TERM}$ set by the voltage source at one end of the termination resistor Zo may represent a binary zero. And, an output voltage level equal to $V_{TERM}-(I*Zo)$ may represent a binary one, where the output driver circuit 323 sinks an amount of current equal to 1. In this way, the bus driver circuits 323 can be implemented as switched current sources that sink current when driving binary one's onto the signal lines. When receiving data, the receiver circuits 324 detect whether the voltage on the signal line is greater than or less than $V_{TERM}-0.5(I*Zo)$, i.e. the midpoint between a logical zero and a logical one, to determine whether the data is a binary zero or one, respectively. In one embodiment, data is transmitted and received on each edge of the system clock to achieve a data rate equal to twice the frequency of the system clock. In an alternative embodiment, data is transmitted once per clock cycle of the system clock.

The output drivers 323 and receivers 324 can operate in either 2-PAM or 4-PAM mode. In one embodiment, the control, address and data signals use the same multi-PAM mode, such as 4-PAM. However, because 4-PAM may be more susceptible to errors from noise than 2-PAM, to improve system reliability, in another embodiments, signals on the bus may use the 2-PAM mode. Additionally, data may alternate between the 2-PAM and 4-PAM mode. For example, a pattern generator may be coupled to the memory controller 321 and may be used to periodically determine whether to operate the system at 2-PAM or 4-PAM. In one embodiment, the pattern generator may be arranged to periodically determine an error rate in the system, and if the error rate is above a predetermined threshold, 2-PAM signaling may be used.

Hereinafter, systems and method for generating reference voltages will be described in reference to multi-PAM systems. However, it should be understood that the methods and systems are equally applicable in 2-PAM systems.

As used herein, the term multi-level signaling refers to signaling schemes utilizing two or more signal levels. Multi-level signaling may also be referred to herein as multiple level pulse amplitude modulation, or multi-PAM, signaling, because the preferred coding methods are based upon the amplitude of the voltage signal. Other known multi-level signaling techniques may alternatively be used. Further, although the multi-level signaling of the preferred embodiments will be described with respect to a current source drivers, different or equivalent drivers could also be used.

Output drivers 323 generate, and receivers 324 detect, multi-PAM signals that allow multiple (k) bits to be transmitted or received as one of $2^k$ possible voltages or data symbols at each clock edge or once per clock cycle. For example, one preferred embodiment is a 4-PAM system in which two bits are represented by $2^2$ or four voltage levels, or data symbols, and the two bits are transferred at every clock edge by transferring an appropriate one of the four voltage levels. Therefore, the data rate of a 4-PAM system is twice that of a binary or 2-PAM system.

Figure 2:
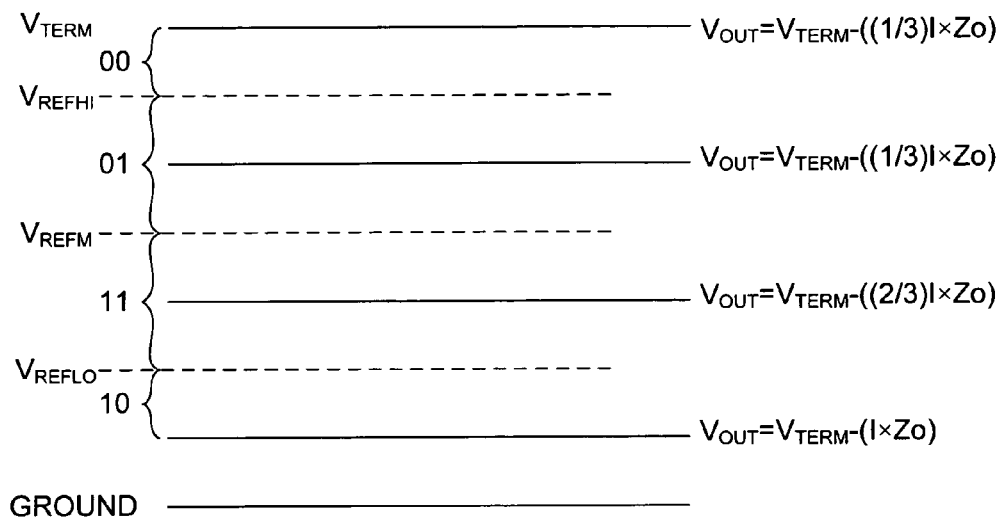
FIG. 2 illustrates a preferred encoding scheme utilizing a multi-level voltage reference for use with a multi-level output driver.

In FIG. 2, a graph shows one embodiment utilizing a 4-PAM signaling scheme. Specifically, the multi-PAM voltage levels are associated with two-bit binary values or symbols such as 00, 01, 10 and 11. In the embodiment of FIG. 2, the binary values are assigned to voltage levels using Gray coding, i.e. the symbol sequence from the highest voltage level to the lowest voltage level is 00, 01, 11, 10. Gray coding provides the advantage of reducing the probability of dual-bit errors because only one of the two bits changes at each transition between voltage levels. If a received 4-PAM voltage symbol is misinterpreted as an adjacent symbol, a single-bit error will occur.

The y-axis of the graph in FIG. 2 shows 4-PAM output voltages $V_{OUT}$ for each symbol. To provide the appropriate voltage to transmit a 4-PAM symbol, the output driver sinks a predetermined amount of current for that symbol. In particular, each symbol is associated with a different amount of current. To transmit the symbol "00", the output driver 323 sinks no current and the signal line is pulled up to $V_{TERM}$. To transmit the symbol "01", the bus output driver 323 sinks a predetermined amount of current I 01 to cause the output voltage $V_{OUT}$ to equal $V_{TERM}$–⅓ (I.Zo), where 101 is equal to ⅓ I. To transmit the symbol "11", the bus output driver 323 sinks a predetermined amount of current I11 to cause the output voltage $V_{OUT}$ to equal $V_{TERM}$ –⅔ (I.Zo), where I11 is equal to ⅔ I. To transmit the symbol "10", the bus output driver 323 sinks a predetermined amount of current I10 to cause the output voltage $V_{OUT}$ to equal $V_{TERM}$–(I.Zo).

A 4-PAM receiver identifies a received symbol based on a voltage range or range of voltages associated with that symbol. A set of reference voltages such as $V_{REFLO}$, $V_{REFM}$ and $V_{REFHI}$ functions as voltage thresholds to define ranges of voltages associated with each 4-PAM symbol. The reference voltages $V_{REFLO}$, $V_{REFM}$ and $V_{REFHI}$ are typically set at the midpoint voltage between neighboring symbols. For example, the symbol "00" is associated with voltages greater than $V_{REFHI}$. The symbol "01" is associated with voltages falling within the range between $V_{REFHI}$ and $V_{REFM}$. The symbol "11" is associated with a range of voltages from $V_{REFM}$ to $V_{REFLO}$. The symbol "10" is associated with a range of voltages less than $V_{REFLO}$. The reference voltages $V_{REFHI}$, $V_{REFM}$ and $V_{REFLO}$ are threshold voltages from which a multi-PAM data symbol is determined to be one of the four possible data symbols.

4-PAM symbols or signals also allow for direct compatibility with 2-PAM or binary signaling. When operating in 4-PAM mode, the received data bits are compared to the three reference voltages, $V_{REFHI}$, $V_{REFM}$ and $V_{REFLO}$ to determine the 4-PAM symbol and the associated two bits. Because the most significant bit (MSB) is determined by comparing the received data bit to $V_{REFM}$, i.e., the MSB is zero for voltages greater than $V_{REFM}$ and the MSB is one for voltages less than $V_{REFM}$, the multi-PAM system can be used as a 2-PAM system by ignoring the least significant bit (LSB) and using the MSB. Alternatively, to transmit 2-PAM symbols using the gray code of FIG. 2, the LSB is set equal to zero (low), while the MSB determines the output voltage. More information on 2-PAM and multi-PAM systems may be found in the co-pending U.S. patent application entitled "Low Latency Multi-Level Communication Interface," identified above and incorporated herein in its entirety and identified above.

Further, although the circuits described herein use 4-PAM signaling, the embodiments described can be expanded for use in 8-PAM, 16-PAM and, more generally, N-PAM signaling. Accordingly, it is to be understood that the preferred @embodiments are not limited to 4-PAM signaling, but rather may be applied to the general, N-PAM signaling, case.

Figure 3:
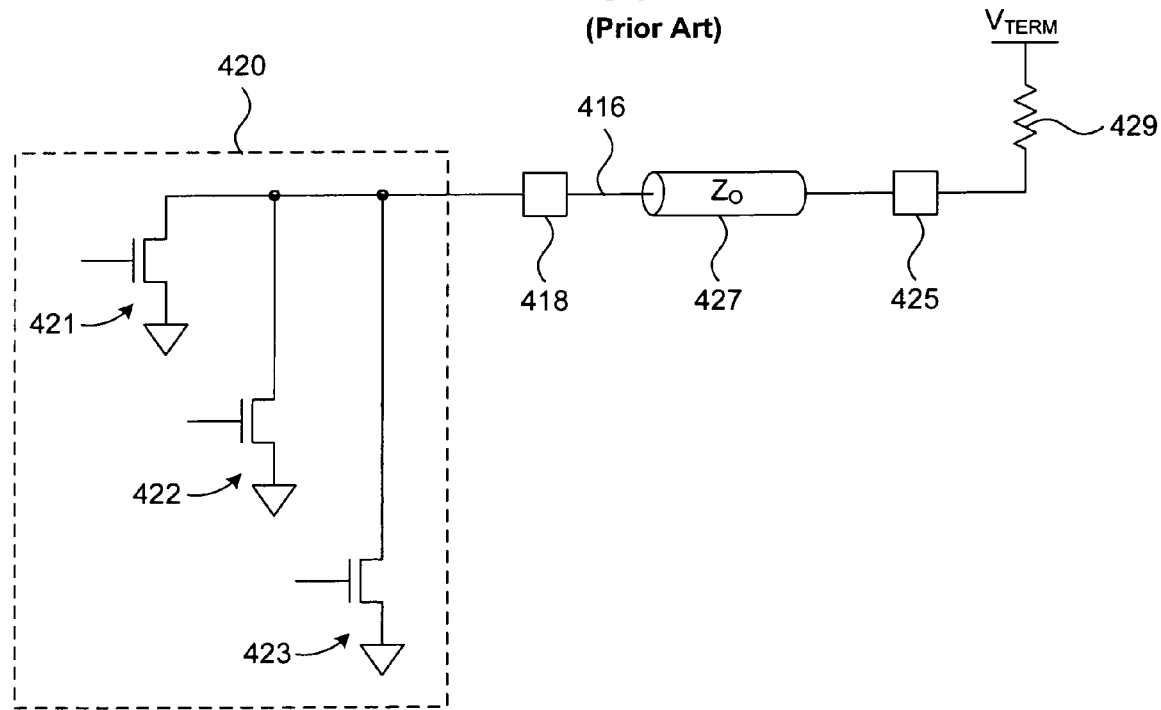
FIG. 3 is a signaling device that may be used to create the multi-level voltage reference of FIG. 2.

FIG. 3 shows a representation of a communication system that may be used to create voltage levels of FIG. 2. An output driver 420 drives signals to an output pad 418 and over a transmission line 416, which may, for example, be a memory bus or a different interconnection between devices affixed to a circuit board, to be received at a pad 425. The transmission line 416 has a characteristic impedance $Z_O$ 427 that is substantially matched to a terminating resistor $Z_O$ 429 to minimize reflections. The output driver includes a first transistor current source 421, a second transistor current source 422, and a third transistor current source 423, which collectively produce a current I when all active, pulling the voltage at the pad 425 down from $V_{TERM}$ by I.Zo, signaling the logical state 10 under the Gray code system. To produce voltage $V_{OUT}=V_{TERM}$, signaling the logical state 00, current sources 421, 422, and 423 are all turned off. To produce voltage $V_{OUT}$ equal to $V_{TERM}$–⅓ (I.Zo), signaling the logical state 01, one of the current sources is turned on, and to produce voltage $V_{OUT}$ equal to $V_{TERM}$–⅔ (I.Zo), two of the current sources are turned on.

Figure 4:
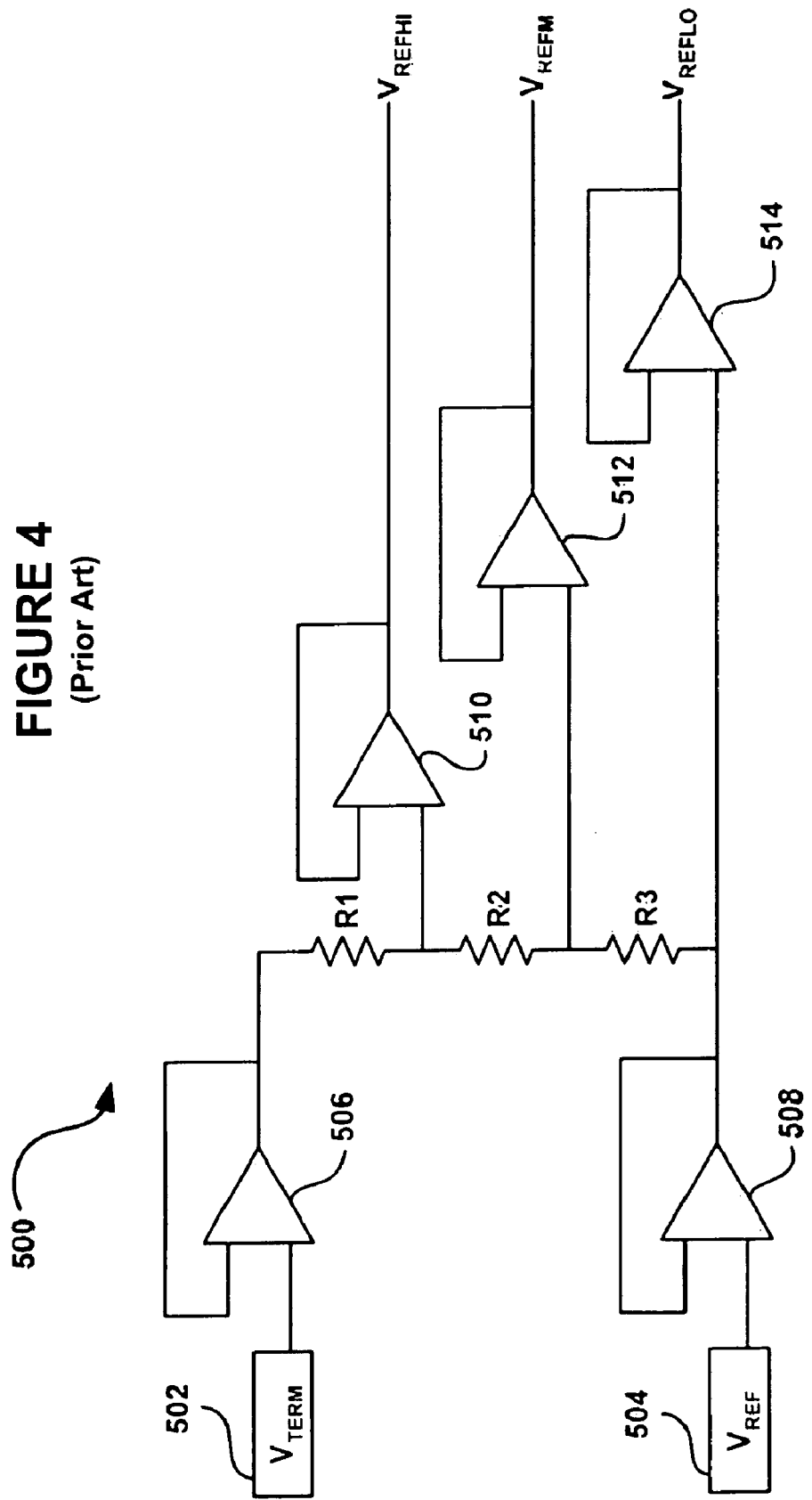
FIG. 4 is an electrical schematic of an on-chip, multi-level reference voltage generator utilizing a resistive voltage divider.

FIG. 4 illustrates an exemplary 4-PAM reference voltage generator 500 that generates the multi-PAM reference voltages $V_{REFHI}$, $V_{REFM}$ and $V_{REFLO}$ from external voltages, $V_{TERM}$ and $V_{REF}$, supplied on input pins 502 and 504 respectively. Unity gain amplifiers 506, 508 receive and output the input voltages $V_{TERM}$ and $V_{REF}$ respectively. A voltage divider, including series-connected resistors R1, R2 and R3, is coupled between the outputs of the unity gain amplifiers 506 and 508. The lowest voltage $V_{REF}$ is selected to drive $V_{REFLO}$ via a power driver 514. Power drivers 510, 512 are coupled between resistors R1, R2 and R3 to provide reference voltages $V_{REFHI}$ and $V_{REFM}$ respectively. The power drivers 510–514 are connected as unity gain amplifiers.

In one embodiment, the resistor values are selected such that resistors R2 and R3 have twice the resistance of resistor R1, and $V_{REF}$, which is supplied externally, is equal to the desired $V_{REFLO}$ voltage.

Figure 5:
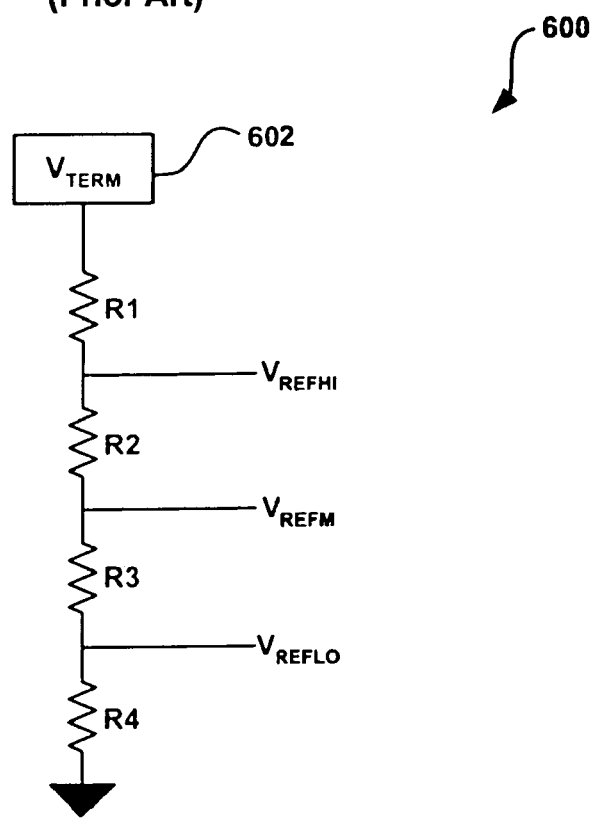
FIG. 5 is an alternative electrical schematic of an on-chip, multi-level reference voltage generator utilizing a resistive voltage divider.

FIG. 5 illustrates an alternative embodiment of a 4-PAM reference voltage generator 500 for generating the multi-PAM reference voltages $V_{REFHI}$, $V_{REFM}$, and $V_{REFLO}$ from the external voltage $V_{TERM}$ supplied on an input pin 602. A voltage divider, including series-connected resistors R1, R2, R3, and R4, is coupled between the $V_{TERM}$ and a ground voltage supplied on an input pin 602. In one embodiment, the resistor values are chosen so that the compromise between the static power consumption and noise immunity is achieved. Thus, the resistor values may be selected so that not too much static power is burned, and, further, so that reference voltages are not susceptible to noise injection. However, it should be understood that the reference voltage generation is not limited to the use of the voltage generators illustrated in FIG. 4 or FIG. 5, and different or equivalent reference voltage generators may alternatively be used.

Figure 6:
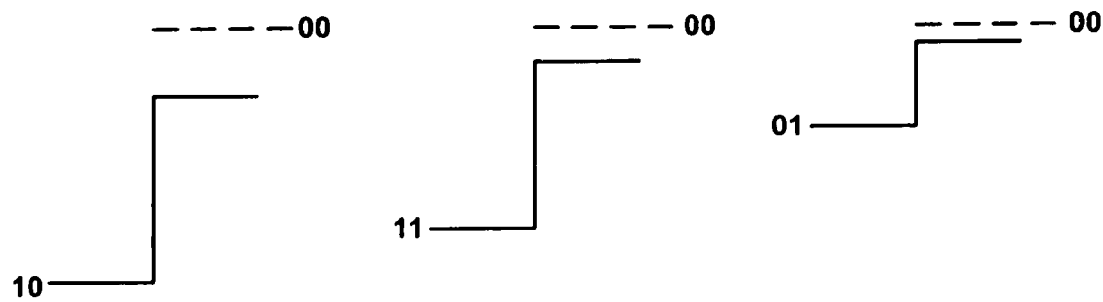
FIG. 6 illustrates attenuation affecting the transitory level obtained by a step.

For cases in which attenuation of a signal exists between the signal's reception and transmission, different amounts of signal loss may occur depending upon the magnitude of the transition between logic levels. FIG. 6 illustrates attenuation affecting the transitory level obtained by a step. For instance, transitioning between the 10 state and the 00 state may have a greater signal deficiency than a transition between the 11 state and the 00 state, which in turn may have a greater signal deficiency than a transition between the 01 state and the 00 state, while maintaining the same logic state over plural bit periods may have no attenuation error. Thus, while the correct dc-level will eventually be achieved, each transition between states may have a different error associated with it.

Figure 7:
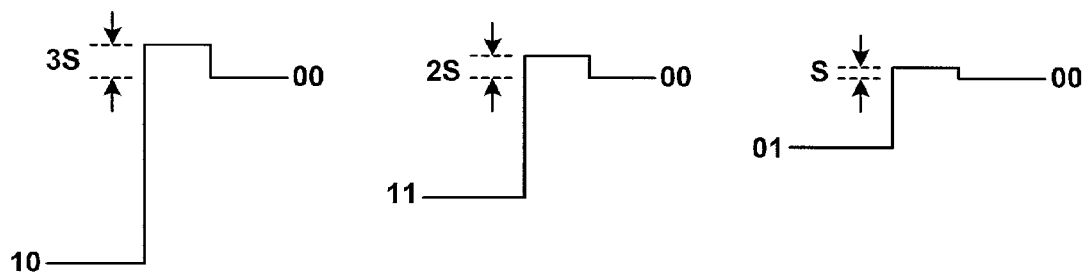
FIG. 7 illustrates addition of equalization signal to the logic state transitions affected by signal attenuation in FIG. 6.

FIG. 7 illustrates the addition of a different equalization signal 3S, 2S, or S to the main signal when driving different transitions to compensate for the attenuation of the received signal. The equalization signals in this embodiment are transitory, so that each signal may, for example, have a duration less than or equal to one bit signal, after which the equalization signal is terminated, allowing the initially overdriven signal to maintain a steady state logic level. In other words, the equalization signals S, 2S or 3S add predetermined high-frequency components to the transition signals that raise the slope of the edge of transition. However, a difficulty with this approach for a system such as shown in FIG. 3 is that the voltage can only be pulled down from the $V_{TERM}$, unless negative current could flow through the current sources 421, 422, and 423. In other words, with the 00 level set at the $V_{TERM}$, as illustrated in FIG. 2, it is difficult for the equalization signals S, 2S or 3S to add to the transition above the $V_{TERM}$.

Figure 8:
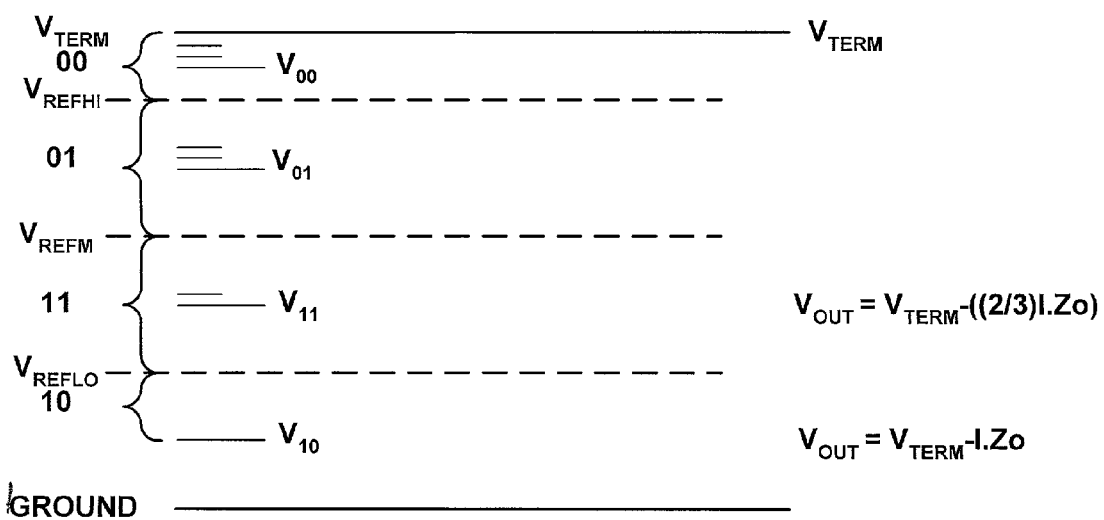
FIG. 8 is an encoding scheme utilizing a multi-level voltage reference where the logic levels are shifted to allow for overdrive signals.

FIG. 8 depicts a multi-level (4-PAM) signaling system in which the 00 logic is reduced below $V_{TERM}$ by a predetermined amount in order to allow overdriving a transition, for example, from the 10 state to the 00 state by a predetermined equalization signal such as 3S via release of the pulldown current. This 00 logic level may be provided by having none of the main current drivers turned on and three equalization drivers turned on, to produce a voltage level of 0M+3S. The logical state 10 can be pulled lower, if necessary, to overdrive a transition, and it is characterized by having three main drivers turned on, for a total voltage level of 3M+0S. The logical state 01 is pulled down and may have a voltage of 1M+2S, while the state 11 may have a voltage of 2M+1S.

Table 1 illustrates drive signal levels involved in transitioning between the logical states of FIG. 8.

TABLE 1

| From | To | First Received Signal | Transition drive Signal | Second Received Signal |
|------|----|-----------------------|-------------------------|------------------------|
| 00 | 10 | 0M+3S | 3M+3S | 3M+0S |
| 00 | 11 | 0M+3S | 2M+3S | 2M+1S |
| 00 | 01 | 0M+3S | 1M+3S | 1M+2S |
| 01 | 00 | 1M+2S | 0M+2S | 0M+3S |
| 01 | 11 | 1M+2S | 2M+2S | 2M+1S |
| 01 | 10 | 1M+2S | 3M+2S | 3M+0S |
| 11 | 00 | 2M+1S | 0M+1S | 0M+3S |
| 11 | 01 | 2M+1S | 1M+1S | 1M+2S |
| 11 | 10 | 2M+1S | 3M+1S | 3M+0S |
| 10 | 00 | 3M+0S | 0M+0S | 0M+3S |
| 10 | 01 | 3M+0S | 1M+0S | 1M+2S |
| 10 | 11 | 3M+0S | 2M+0S | 2M+1S |

In order to transition from the initial state 00 (0M+3S) to the final state 10 (3M+3S), for example, an overdriven transition drive signal of 3M+3S is provided. Conversely, changing from the initial state 10 (3M+0S) to the final state 00 involves a drive signal of 0M+0S. Table 1 illustrates one set of transition drive signals specific to a 4-PAM signaling system with a single error correction. However, it should be understood that the illustrated set of transition signals may be extrapolated to be used with communication systems having additional signal levels and additional error corrections. Further, it should be understand that similar transition drive signals could also be used in 2-PAM systems with equalization.

Figure 9:
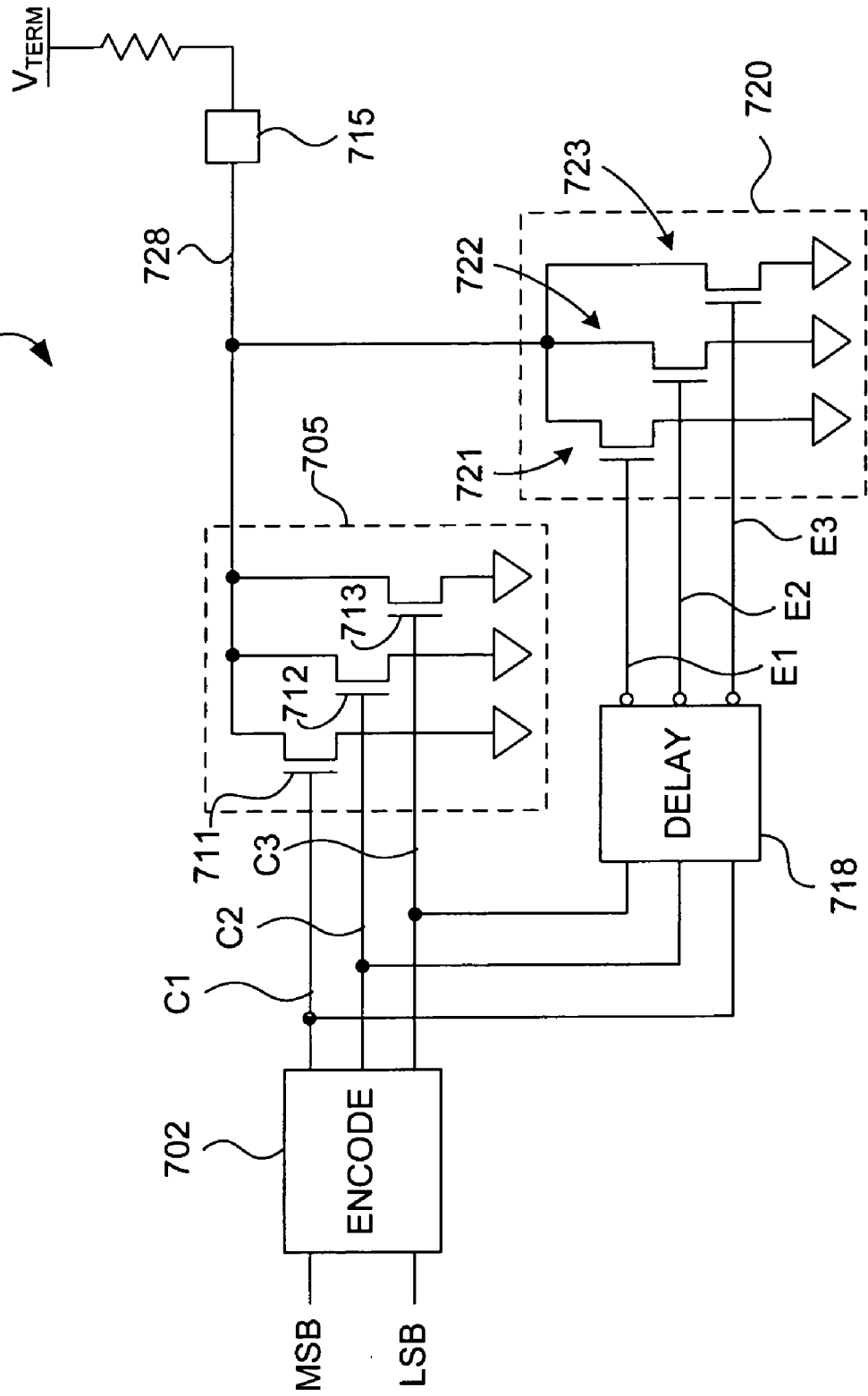
FIG. 9 illustrates a device that can provide overdrive signals to compensate for signal attenuation.

FIG. 9 is a schematic block diagram illustrating an exemplary device 700 that may provide the transition drive signals shown in FIG. 8. An encoder 702 receives binary MSB and binary LSB signals and converts pairs of those 2-PAM signals into digital input signals along lines C1, C2 and C3 for a main driver 705 having three current sources 711 712, and 713, to convert the binary data of the MSB and LSB into 4-PAM data at an output pad 715. As illustrated in FIG. 9, a delay mechanism 718 also receives the input signals from the encoder 702. The delay mechanism 718 inverts and delays the input signals by a one-bit signal period to feed signals E1, E2, and E3 to an auxiliary driver 720 including auxiliary driver current sources 721, 722, and 723 that are similar to the respective main driver current sources 711, 712 and 713. However, each auxiliary driver current source 721, 722, and 723 has a gain that is a fraction of the respective main driver current sources 711, 712, and 713. Thus, when the main driver 705 outputs an output signal, the auxiliary driver 720 outputs a signal that is delayed, inverted and proportional to the output signal of the driver 705. The signals generated by drivers 705 and 720 combine at the line 728 to form a desired signal. A detailed description of a preferred equalization system can be found in the co-pending U.S. patent application Ser. No. 09/654,643, entitled "Low Latency Equalization in Multi-Level, Multi-Line Communication Systems," identified above. The preferred embodiments, however, are applicable to systems using other types of equalization, and the invention should not be construed as limited to systems including the described equalization methods.

Referring to Table 1, the main driver 705 can be represented with the letter M and the auxiliary driver 720 can be represented with the letter S, with the numeral proceeding each letter describing how many of the respective current sources are active. A ratio of the gain of the auxiliary driver, S, to that of the main driver, M, is termed k, the equalization coefficient of the auxiliary driver. The ratio k is less than one, and may range from about one percent to about fifty percent. Thus, the driving device on the bus knows the equalization current based on the equalization coefficient set on the auxiliary driver. In one embodiment, the drivers 705 and 720 and the delay element 718 of FIG. 9 may be represented as an FIR filter, where the input signals from the encoder 702 are sent to the filter, which operates on the signals to output a filtered signal.

Figure 10:
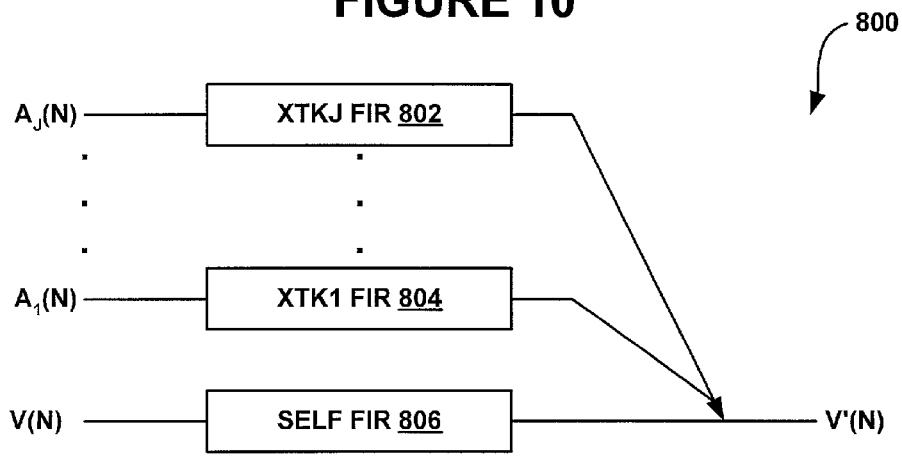
FIG. 10 illustrates a general equalization system for a signal line, including a self-equalization FIR filter and a number of crosstalk equalization FIRs.

Equalization techniques similar to those described above for the attenuation can be used to compensate for crosstalk and reflection errors. FIG. 10 and FIG. 11 including FIGS. 11A, 11B, 11C, 11D and 11E, show a general system using a self equalization FIR filter 806 and crosstalk (XTK) equalization FIR 804 and crosstalk equalization FIR filter 802 for filtering errors on a line V(n) due to crosstalk from adjacent lines $A_i(n)$ through $A_j(n)$, respectively, to produce equalized output V(N).

Figure 11A:
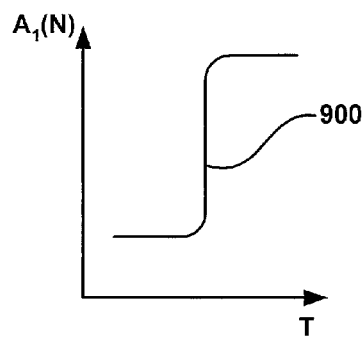
FIG. 11A illustrates a signal transition that may create crosstalk on adjacent signal lines.
Figure 11B:
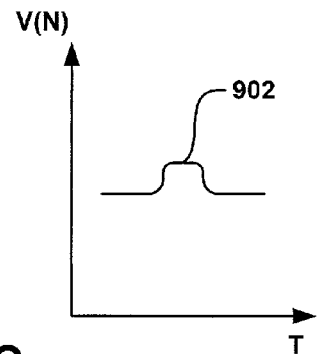
FIG. 11B illustrates crosstalk noise from the signal transition of FIG. 11A, imposed on a signal in an adjacent line.
Figure 11C:
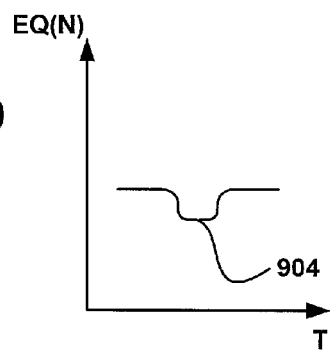
FIG. 11C illustrates an equalization signal that compensates for the crosstalk noise shown in FIG. 11B.
Figure 11D:
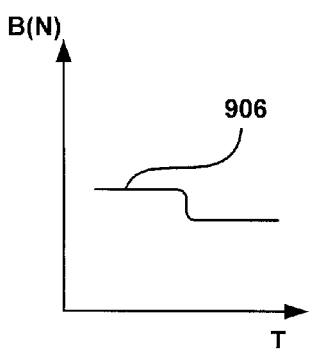
FIG. 11D illustrates a first component of the equalization signal shown in FIG. 11C.
Figure 11E:
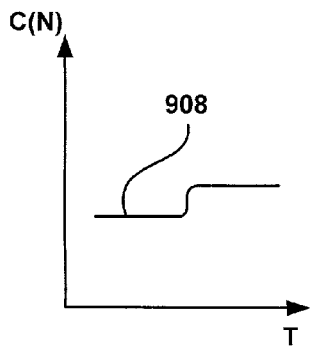
FIG. 11E illustrates a second component of the equalization signal shown in FIG. 11C.

FIG. 11A shows a step function signal 900 on the line Al that generates, as shown in FIG. 11B, a transient signal 902 in line V due to inductive coupling. FIG. 11C shows an equalization signal 904 that is generated by inputting the signal 900 to the crosstalk equalization FIR filter 804 to compensate for transient signal 902. Capacitive crosstalk generated in line V from lines $A_f$ through $A_j$ can be equalized in a similar fashion. Both inductive and capacitive crosstalk may generate a transient signal having a polarity dependent upon the location of the receiver compared to the location at which the transient signal was generated. FIG. 11D shows a first signal component 906 that may be used to compensate for such an inductive or capacitive crosstalk error, which is a scaled and inverted function of the signal 900 that generated the error. FIG. 11E shows a second signal component 908 that may be added to the signal 906 to create the crosstalk equalization signal 904 of FIG. 11C. The signal 908 can be scaled or a fractional function of signal 900 that is delayed one bit period.

Figure 12:
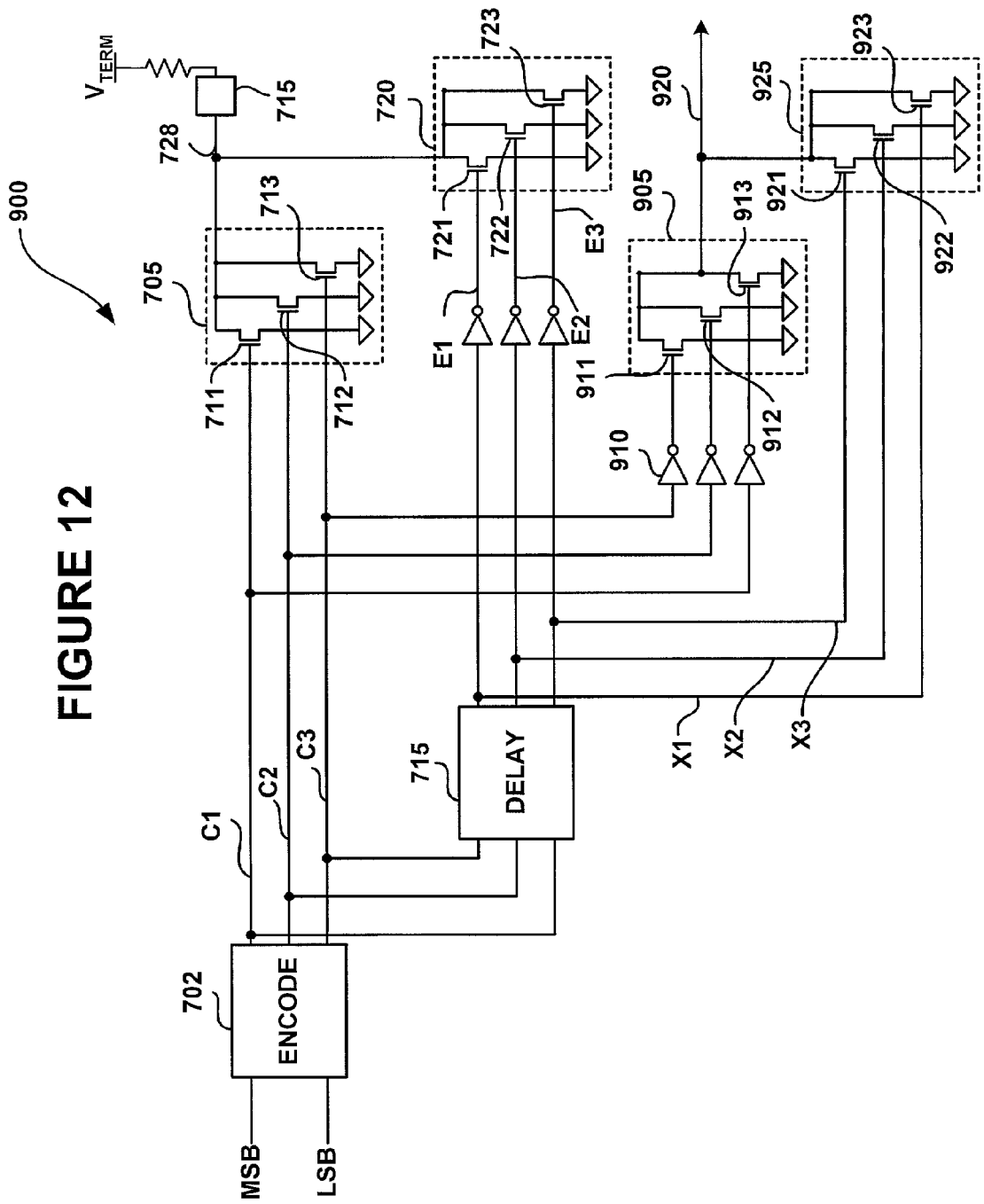
FIG. 12 is a signal driver, self-equalization and crosstalk equalization communication device.

FIG. 12 illustrates an exemplary electrical schematic of a device 900 that may be coupled to a device illustrated in FIG. 9 and can be used to equalize inductive or capacitive errors created by signals in line 728 and sensed in lines that are adjacent to the line 728. A first crosstalk equalization driver 905 receives signals along lines C1, C2 and C3 that have been inverted by inverters 910 controlling current sources 711, 712, and 713. The combined current from the current sources 911, 912, and 913 is output on a crosstalk equalization line 920 that is connected to an adjacent line, not shown, that is subjected to crosstalk errors from the line 728. The output on the line 920 from the driver 905 is thus scaled and inverted compared to the signal produced by the main driver 705, much like the signal 906 of FIG. 11D is scaled and inverted compared to the signal 900 in FIG. 11A.

A second crosstalk equalization driver 925 receives input signals along lines X1, X2, and X3 that have been delayed by the delay 715, where the lines X1, X2 and X3 control the current sources 921, 922 and 923. Thus, the output of the second crosstalk equalization driver 925 on the line 920 is delayed and scaled compared to the signals produced by the main driver 705, much like the signal 908 of FIG. 11E is scaled and delayed compared to the signal 900 in FIG. 11A. The combined output of the crosstalk equalization driver 905 and 925 on the line 920 is much like the signal 904 of FIG. 11C, which can be used to compensate for the transient signal 902 of FIG. 11B. Thus, the crosstalk equalization drivers 905 and 925 can compensate for the crosstalk inflicted by the line 728 on nearby lines. Similarly to the equalization cancellation, the crosstalk cancellation employs a predetermined crosstalk cancellation current based on the crosstalk coefficients used in the system. More information on alternative embodiments for equalization and crosstalk cancellation may be found in the co-pending U.S. patent application Ser. No. 09/654,643, entitled "Low Latency Equalization in Multi-Level, Multi-Line Communication Systems," identified above. The preferred embodiments, however, are applicable to systems using other types of equalization and crosstalk cancellation, and the invention should not be construed as being limited to systems that include equalization and crosstalk cancellation.

As mentioned in reference to FIG. 8, in order to compensate for attenuation, crosstalk or reflection errors using, for example, the equalization drivers illustrated in FIG. 12, the highest output logic state is reduced below the $V_{TERM}$ and the lower logic states are shifted respectively based on the equalization and/or crosstalk currents that are used on a device to compensate for signal errors. In such an embodiment, the $V_{REFHI}$, $V_{REFM}$ and $V_{REFLO}$ are no longer centered on the shifted data eyes, and, thus do not track errors associated with the current control.

Typically, an electronic device on a bus, such as the bus 302 illustrated in FIG. 1, does not set its equalization or crosstalk coefficients until it is assigned to a predetermined signal line, or a signal channel, such as one of the signal lines 320-1 or 320-2 illustrated in FIG. 1. However, when a device is put on a signal line, the device adapts a predetermined set of equalization and/or crosstalk coefficients based on the characteristics of the signal line. Thus, any device on the bus, once put on a signal line, has a direct knowledge of its default and crosstalk currents that shift the logic states down in order to allow equalization and crosstalk signals to overdrive logic state transitions. In accordance with a preferred embodiment, the reference voltage levels are shifted correspondingly to the logic state shifts so that the reference voltage levels provide accurate threshold levels.

Exemplary embodiments for reference voltage generation will be described hereinafter in reference to a 4-PAM system. However, it should be understood that the exemplary embodiments are equally applicable in 2-PAM or N-PAM systems.

Figure 13:
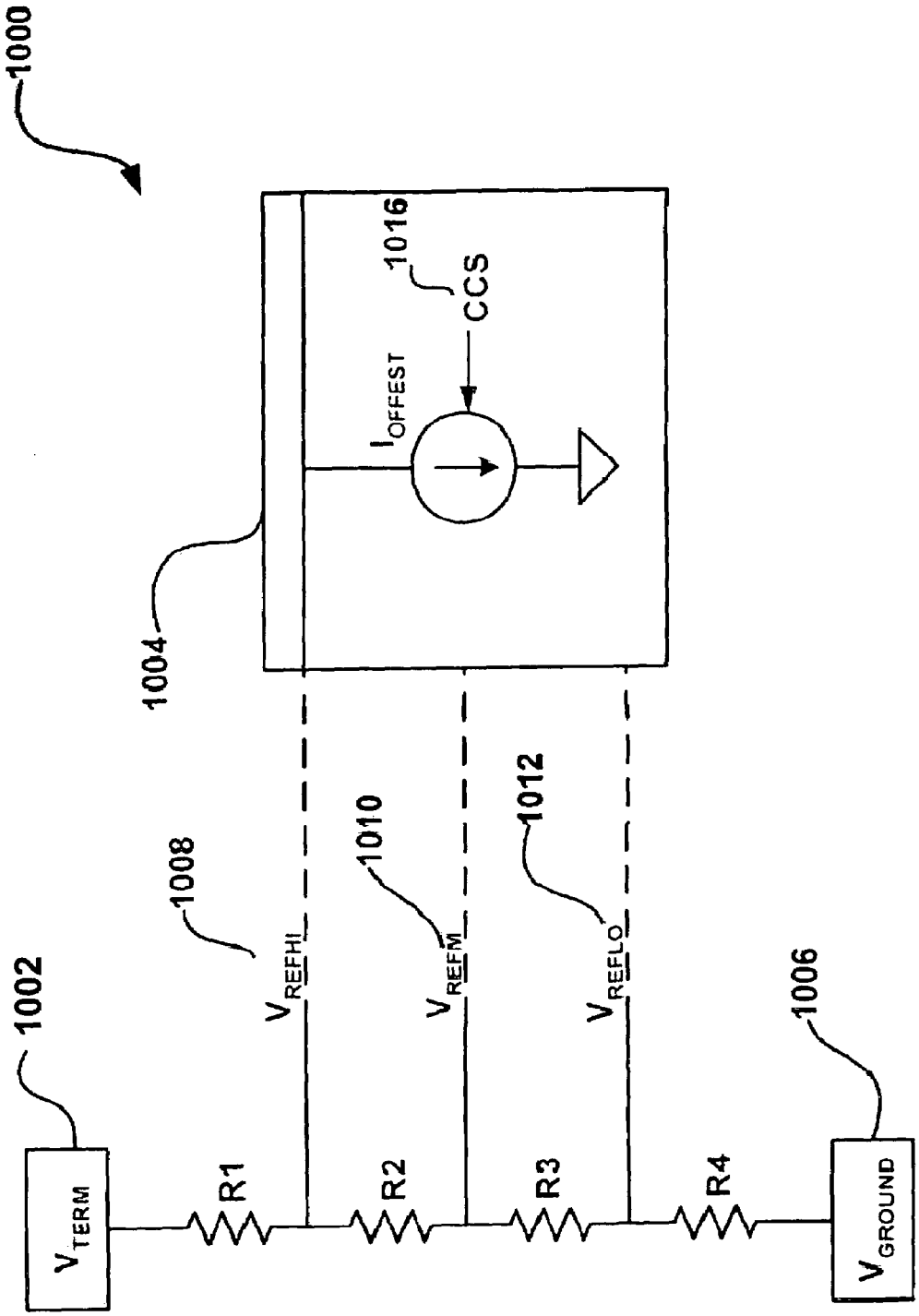
FIG. 13 is an electrical schematic of an on-chip, multi-level reference voltage generator utilizing a resistive voltage divider, where the multi-level reference voltage reflects logic state shifts.

FIG. 13 illustrates a 4-PAM voltage generator 1000 that generates the multi-PAM reference voltages $V_{REFHI}$, $V_{REFM}$ and $V_{REFLO}$ on respective reference-voltage nodes 1008, 1010, and 1012 from the external voltage $V_{TERM}$ supplied on a voltage pin 1002 using a voltage divider, where the reference voltage levels reflect the shifts in the logic state level shifts in a system employing equalization and/or crosstalk signals. The voltage divider, including series-connected resistors R1, R2, R3, and R4, is coupled between the voltage pin 1002 supplying the $V_{TERM}$ and a voltage pin 1006 supplying a $V_{GROUND}$.

According to an embodiment illustrated in FIG. 13, one or more active devices on a channel, such as an active device 1004, level-shifts the reference voltage levels based on the logic state shifts. As mentioned in the preceding paragraphs, the logic states are shifted down based on predetermined equalization and crosstalk currents applied by a device on a bus. As illustrated in FIG. 13, the active device 1004 includes an active current source generating an offset current ("$I_{OFFSET}$") that is controlled by one or more current control signals ("CCS") 1016. In one embodiment, the CCS 1016 is controlled by a set of equalization and crosstalk coefficients used by a device on the bus so that the active device 1004 draws a scaled amount of the current used for the highest logic state equalization and crosstalk cancellation. In an embodiment, a scale factor associated with the equalization and crosstalk current corresponds to a ratio of the termination resistor $Z_O$ and the first resistor R1 of the voltage divider. In such an embodiment, the $I_{OFFSET}$ is equal to $I_{EQ,XTC}\cdot(Zo/R1)$, where the $I_{EQ,XTC}$ corresponds to a combined equalization and crosstalk current used by a device on a bus. Thus, the active device 1004 pulls down the reference voltage levels $V_{REFHI}$, $V_{REFM}$ and $V_{REFLO}$ according to the voltage shifts of the logic states. Table 2 illustrates reference voltage levels for the 4-PAM device that may be implemented using the active device illustrated in FIG. 13.

TABLE 2

| Reference Voltage Level | Output Voltage |
|---|---|
| $V_{REFHI}$ | $V_{REFHI} = V_{TERM}\left(\dfrac{R2 + R3 + R4}{R1 + R2 + R3 + R4}\right) - R1 \cdot I_{OFFSET}$ |
| $V_{REFM}$ | $V_{REFM} = V_{REFHI}\left(\dfrac{R3 + R4}{R2 + R3 + R4}\right)$ |
| $V_{REFLO}$ | $V_{REFM} = V_{REFHI}\left(\dfrac{R4}{R2 + R3 + R4}\right)$ |

According to the output voltage levels illustrated in Table 2, the active device 1004 pulls a predetermined amount of current from the $V_{REFHI}$ level based on the equalization and crosstalk settings used on a device. Further, as illustrated in Table 2, the lower reference voltage levels $V_{REFM}$ and $V_{REFLO}$ are shifted based on the $V_{REFHI}$ level so that the new levels for the $V_{REFM}$ and $V_{REFLO}$ provide accurate threshold levels for the logic states below the highest logic state.

However, it should be understood that more than one active device could also be used, and the present invention is not limited to the use of a single active device. In a bi-directional or multi-drop bus, e.g. a memory bus, having a number of individual drivers, each with different equalization or crosstalk coefficients, each driver on a channel may have an active device to shift the reference voltage levels. In such an embodiment, the amount of current to make the $V_{REF}$ shift may be equal to a ratio of that current to the equalization/crosstalk component so that the current is properly ratioed.

Further, it should be understood that the reference voltage generation according to an exemplary embodiment is not limited to using the voltage generator 1000 illustrated in FIG. 13.

Figure 14:
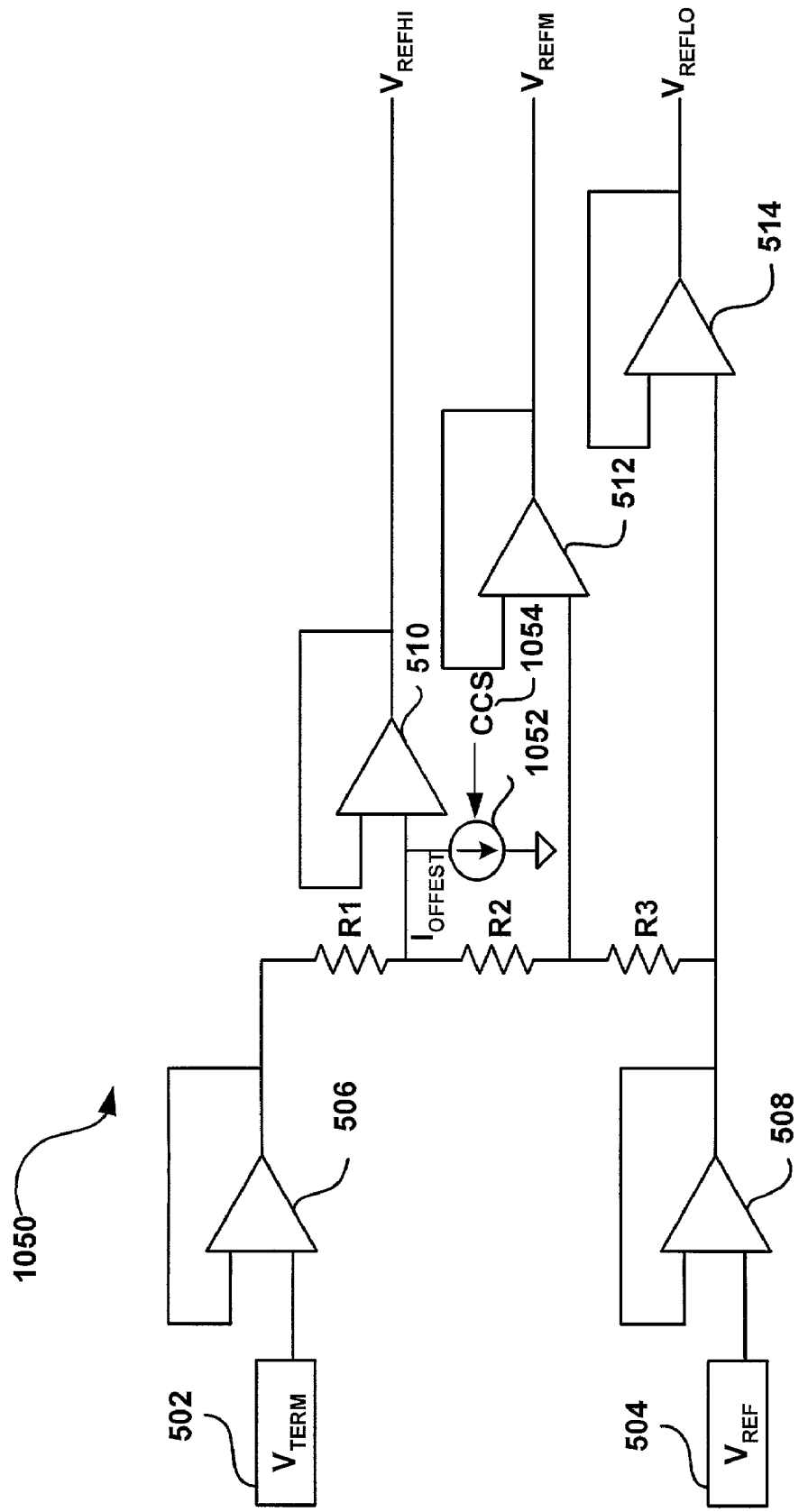
FIG. 14 is an electrical schematic of a multi-level reference voltage generator utilizing op-amp drivers, where the multi-level reference voltage reflects logic state shifts.

FIG. 14 is an electrical schematic 1050 of a multi-level voltage generator that reflects logic state shifts due to equalization or crosstalk cancellation and utilizes the op-amp drive references illustrated in FIG. 4. As illustrated in FIG. 14, one or more active current sources, such a current source 1052, generates an offset current ("$I_{OFFSET}$") that is controlled by one or more CCS 1054. The current source 1052 shifts the reference voltage levels based on equalization or crosstalk cancellation parameters. In the illustrated embodiment, the offset current pulls down the op-amp reference voltage levels as discussed in greater detail in reference to FIG. 13.

Figure 15:
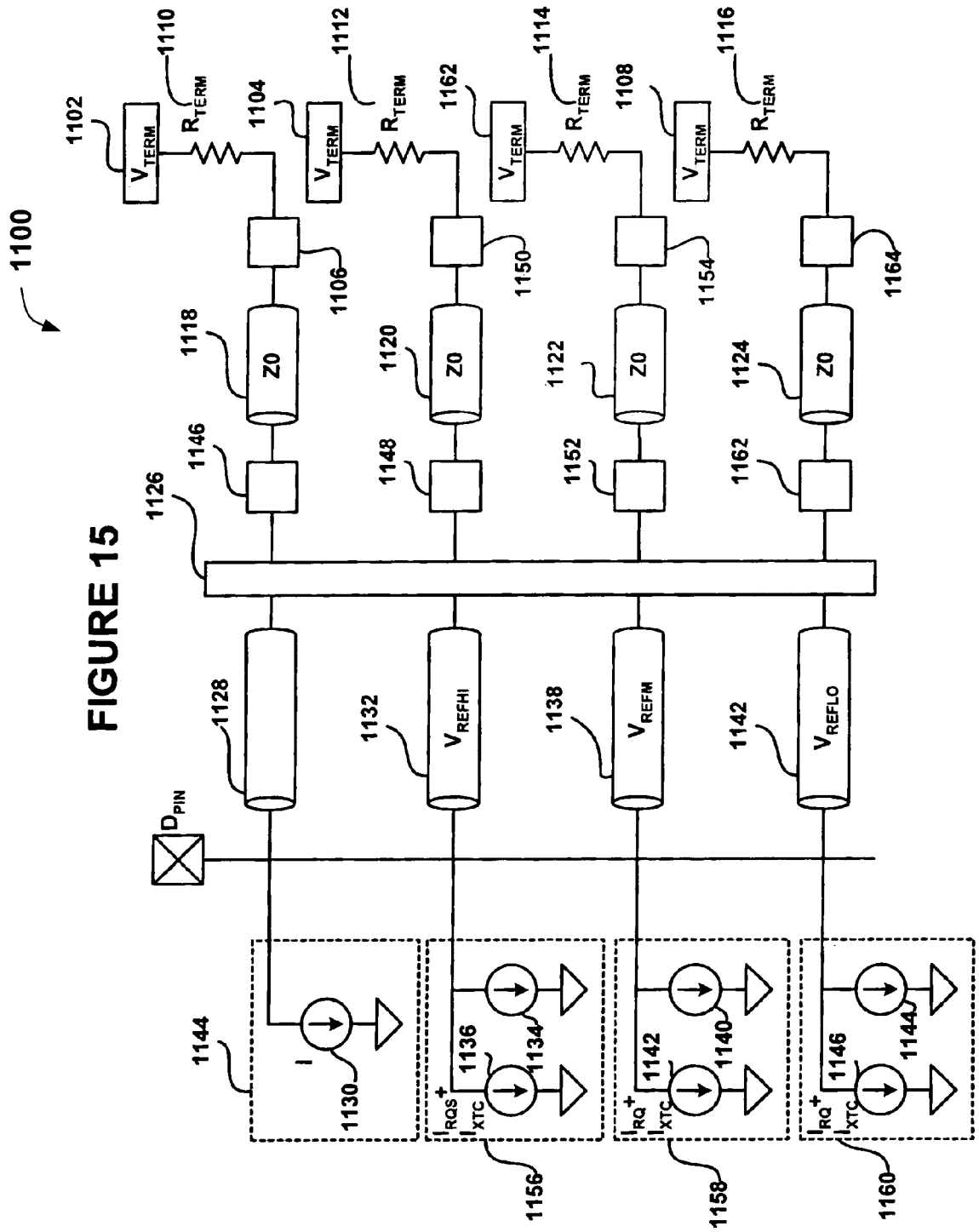
FIG. 15 is an electrical schematic of an on-chip multi-level reference voltage generator utilizing on-chip drivers, where the multi-level reference voltage reflects logic state shifts.

FIG. 15 illustrates an alternative embodiment of an electronic circuit 1100 that generates level-shifted reference voltages $V_{REFHI}$, $V_{REFM}$, and $V_{REFLO}$ via on-chip $V_{REF}$ drivers. An output driver 1144 drives signals to an output pad 1146 and over a transmission line having a characteristic impedance $Z_O$ 1118 that is substantially matched to a terminating resistor $R_{TERM}$ to minimize reflection. The output driver 1144 may include three current sources, as illustrated in FIG. 3, which together produce a current I 1130 when all are active, pulling the voltage at the pad 1106 down from $V_{TERM}$ by $I.Z_O$, signaling the logical state 10 under the Gray code system, as illustrated in FIG. 2. To produce the remaining logical states, some of the transistors in the current drivers are deactivated, as described in reference to FIG. 2.

FIG. 15 illustrates three additional drivers for generating the $V_{REFHI}$, $V_{REFM}$, and $V_{REFLO}$. For example, the current driver 1156 drives into a terminating resistor $R_{TERM}$ 1112 half of the current that would normally be driven to generate the logical state 01 under the Gray code system and, further, shifts the $V_{REFHI}$ level according to the equalization and crosstalk currents applied on the chip. Thus, the current driver 1134 drives a current I/6 to generate the $V_{REFHI}$ level that is further shifted by the current driver 1136 to compensate for the equalization and crosstalk.

Similarly, to generate the $V_{REFM}$ voltage level, a current driver 1158 drives into a terminating resistor $R_{TERM}$ 1116 three-fourths of the current that would normally be driven to generate the logical state 11 under the Gray code system, and, further, shifts the $V_{REFM}$ level according to the equalization and crosstalk current applied on the chip. Thus, the current driver 1140 drives a current I/2 to generate the $V_{REFM}$ level that is further shifted by the current driver 1142 to compensate for the equalization and crosstalk. Finally, as illustrated in FIG. 15, to generate the $V_{REFLO}$ voltage level, a current driver 1160 drives into a terminating resistor $R_{TERM}$ 1114 five-sixth of the current that would normally be driven to generate the logical state 10 under the Gray code system and, further, shifts the $V_{REFLO}$ level according to the equalization and crosstalk currents applied on the chip. Thus, the current driver 1140 drives a current ⅚ I. to generate the $V_{REFLO}$ level that is further shifted by the current driver 1146 to compensate for the equalization and crosstalk. According to one embodiment, the equalization currents 1136, 1142 and 1146 are equal to the voltage shift used to compensate for crosstalk and equalization.

Two reference current generation techniques have been described in reference to FIGS. 13, 14 and 15. However, any one of those could be eliminated, and an off-chip voltage divider could be used instead. In such an embodiment, for example, the $V_{REFM}$ could be used from a 2-PAM-compatible-style board.

Figure 16:
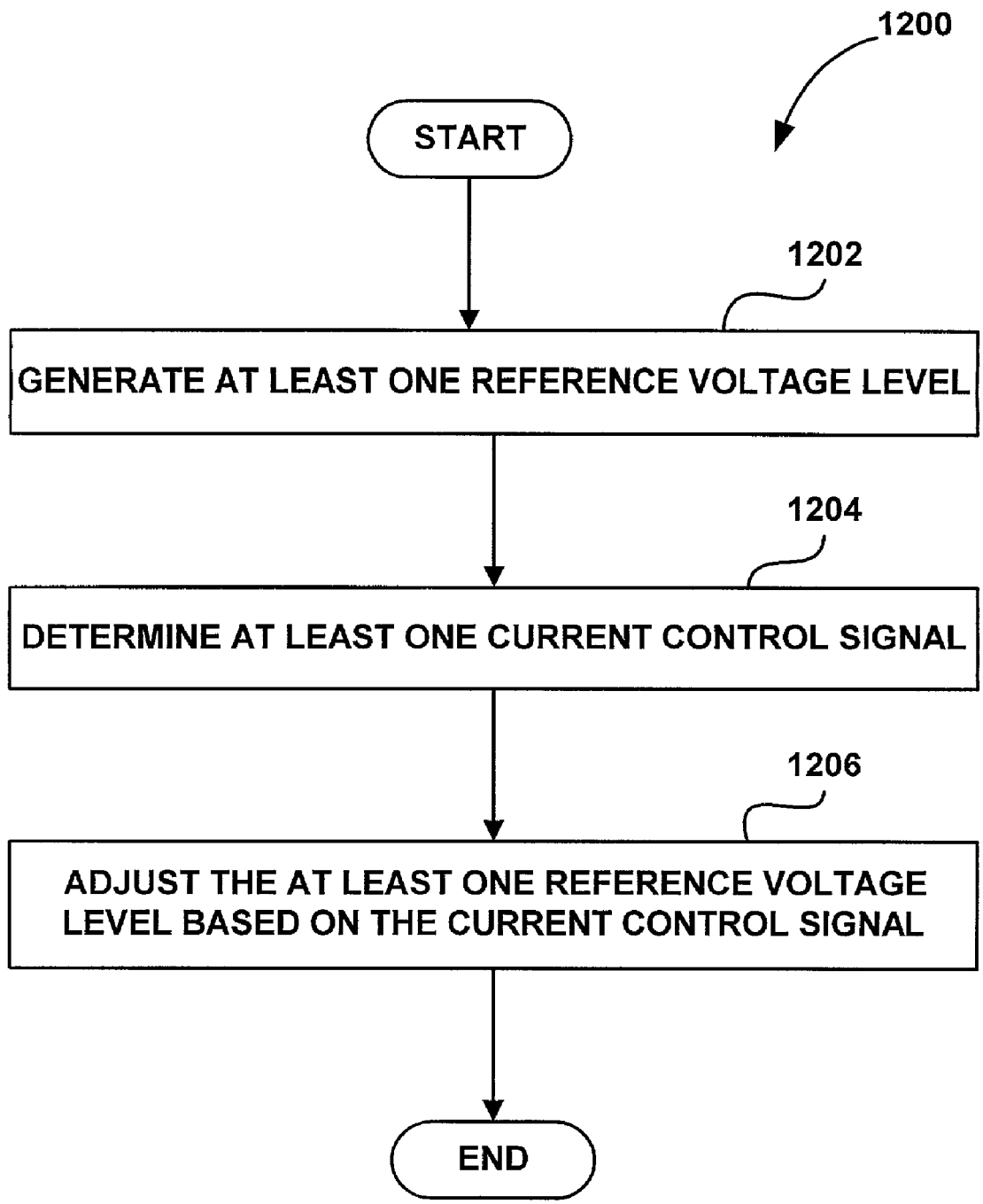
FIG. 16 is a flow chart illustrating an exemplary method for generating at least one reference voltage level for a driver using equalization and crosstalk cancellation.

Referring to FIG. 16, a method 1200 for generating at least one reference voltage level for a driver employing equalization and crosstalk cancellation will be described.

At step 1202, a reference voltage generator generates at least one reference voltage. For example, in a 2-PAM system, the voltage generator generates one reference voltage, and in a 4-PAM system, the voltage generator generates three reference voltage levels. In one embodiment, the voltage generator may include the reference voltage generators described in reference to FIGS. 13, 14 or 15; however, different voltage generators could also be used.

At step 1204, at least one current control signal is determined. The at least one current control signal may include an equalization current control signal, a crosstalk current control signal, or the combination of both.

At step 1206, at least one reference voltage level generated by the reference voltage generator is adjusted based on the at least one current control signal determined at step 1204. According to an exemplary embodiment, the at least one reference voltage level is shifted down based on the shift of the highest logic state required by the use of the control signals.

It should be understood that the method 1200 is only an exemplary method, and different or equivalent methods may be used to generate reference voltages based on at least one control signal such as an equalization current control signal or a crosstalk signal.

Figure 17:
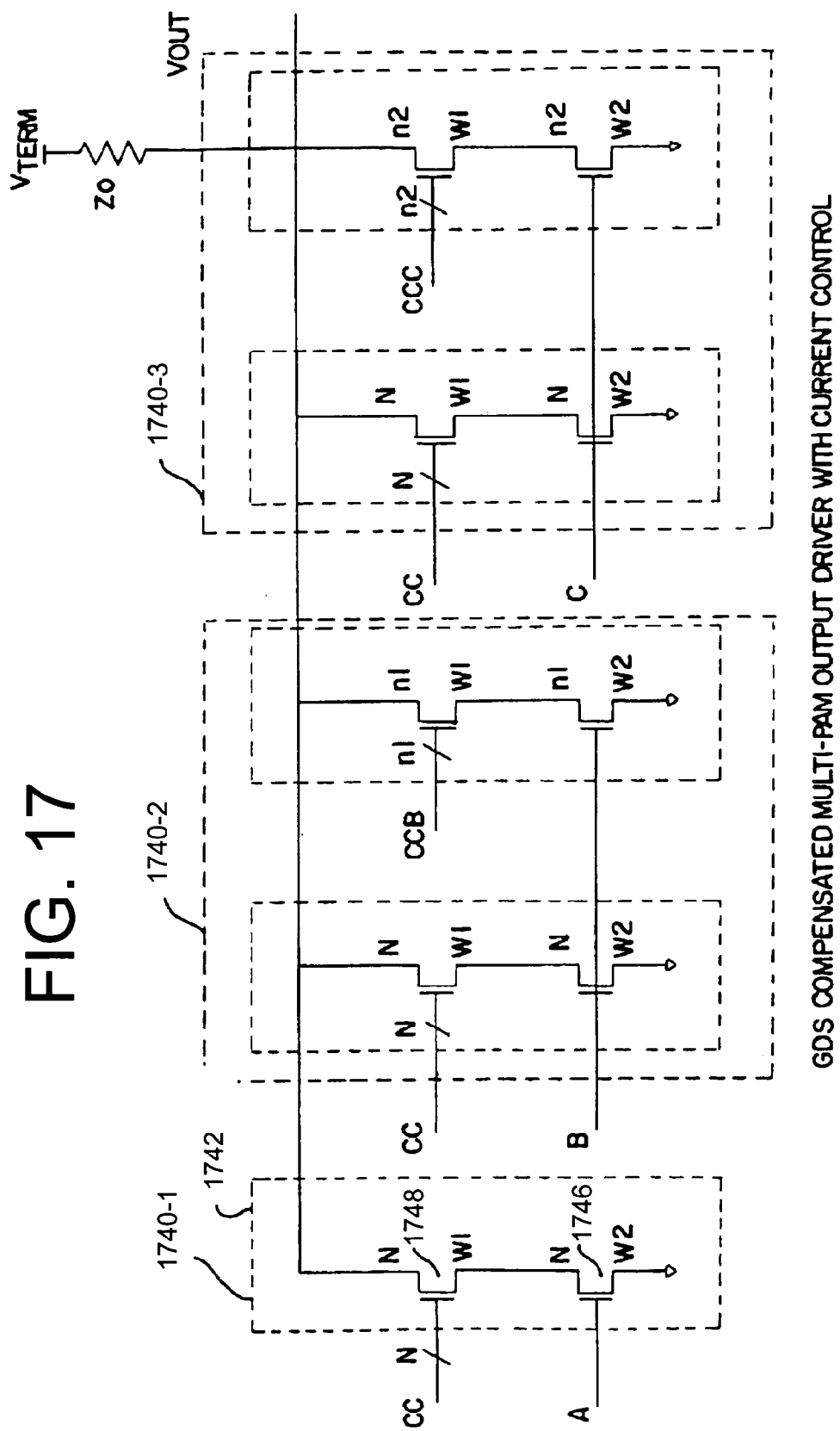
FIG. 17 is an electrical schematic of a $g_{ds}$ compensated, multi-level output driver with current control circuitry.

In FIG. 17, a 4-PAM output driver corrects the $g_{ds}$ distortion and provides current control. As described above, the signals A, B and C preferably determine the output voltage or symbol in accordance with the gray-coded binary signaling shown in Table 2, above. In addition, three sets of current control calibration bits, CC, CCB and CCC, respectively determine the amount of current supplied by the output driver for various combinations of A, B and C. The first set of control bits CC provides primary current control, while the second and third sets of current control bits, CCB and CCC, respectively, fine tune the amount of current. The first set of current control bits CC has N bits; the second set of current control bits CCB has n1 bits; and the third set of current control bits CCC has n2 its. In one embodiment, the relationship between the number of current control bits is as follows:

$$n1 \leq n2 < N.$$

There may be different relationships between N, n1 and n2 in alternative embodiments.

Each of the A, B and C signals is associated with a current drive block 1740 to drive a predetermined amount of current associated with the symbol. Each current drive block 1740 includes one or more sets of stacked transistor pairs 1742 that are associated with each set of current control bits for that current driver block 1740. For example, the current drive block 1740-1 that drives the A signal receives current control bits CC. The current drive block 1740-2 that drives the B signal receives current control bits CC and CCB. The amount of current supplied by current drive block 1740-2 is adjusted for gds distortion using the CCB bits. The current drive block 1740-3 that drives the C signal receives current control bits CC and CCC. The amount of current supplied by current drive block 1740-3 is adjusted for $g_{ds}$ distortion using the CCC bits.

Figure 18:
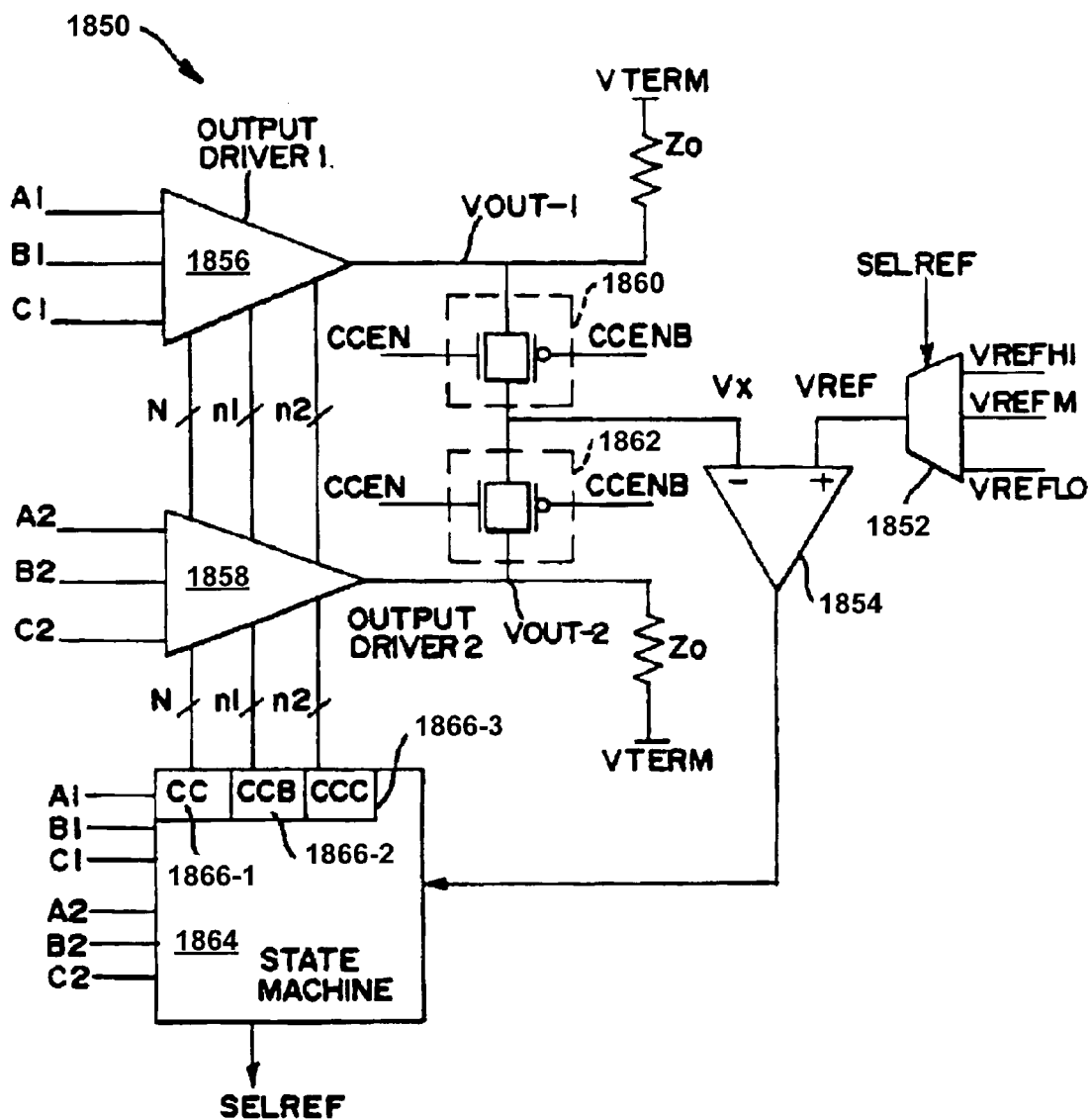
FIG. 18 is an electrical schematic of a circuit for calibrating a $g_{ds}$ compensated output driver with current control circuitry.

As shown in FIG. 18, a current control calibration circuit 1850 determines the settings for the current control bits CC, CCB and CCC by selecting a current control reference voltage, $V_{REF}$, and comparing the current control reference voltage, $V_{REF}$, to a voltage at a mid-point between two calibration output voltages, $V_{OUT}$-1 and $V_{OUT}$-2. The current calibration circuit 1850 determines settings for each of the sets of current control bits CC, CCB and CCC for each 4-PAM output voltage such that $V_{OUT}$-1 and $V_{OUT}$-2 provide each adjacent pair of voltage levels to the circuit.

A multiplexer 1852 receives the three 4-PAM reference voltages $V_{REFHI}$, $V_{REFM}$ and $V_{REFLO}$. A select reference voltage signal, SelRef, selects one of the referenced voltages as the selected current control reference voltage, $V_{REF}$. A comparator 1854 compares the selected current control reference voltage $V_{REF}$ to a mid-point voltage $V_X$ and generates a comparison signal.

To generate the mid-point $V_X$, output driver 1 1856 sinks a first amount of current to provide the first output voltage $V_{OUT}$-1 and output diver 2 1858 sinks a second amount of current to provide the second output voltage $V_{OUT}$-2. Two passgate pairs 1860 and 1862, in response to a current control enable and its complementary signal, act as a resistor divider to provide the midpoint voltage, $V_X$, between the first output voltage, $V_{OUT}$-1, and the second output voltage, $V_{OUT}$-2.

A state machine 1864 includes first, second and third counters, 1866-1, 1866-2 and 1866-3 that provide the first, second and third sets of current control bits, CC, CCB and CCC, respectively. If the comparison signal indicates that the midpoint signal $V_X$ is greater than the reference voltage $V_{REF}$, the state machine 1864 increments an associated set of current control bits by one to increase the amount of current that is sunk by the output driver, thereby decreasing the midpoint voltage. If the midpoint voltage signal $V_X$ is less than the current control reference voltage, $V_{REF}$, the state machine 1864 decrements the associated current control bits by one, thereby increasing the midpoint voltage.

In one embodiment, the current control bits are calibrated during a power-up sequence. The theory of operation for calibrating the current control bits is as follows. The first set of current control bits CC provide the primary amount of current control for each current control block 1740 (FIG. 17). To compensate for gds distortion, the CCB and CCC current control bits fine tune the amount of current associated with the Gray-coded "11" and "10" signals, respectively. The current control bits are calibrated in the following order: CC, CCB, and then CCC.

The first and main set of current control bits CC are set using the voltage differences between the "00" and "01" symbols. The first set of current control bits CC are set to provide an amount of current to provide the output voltage for the "01" symbol such that $V_{REFHI}$ is placed at the midpoint between the output voltage for the "00" symbol and the output voltage for the "01" symbol. Because of $g_{ds}$ distortion, without compensation, the voltage difference between the "01" symbol and the "11" symbol is less than the voltage difference between the "00" symbol and the "01" symbol. To compensate for the $g_{ds}$ distortion, the output voltage for the "11" symbol is decreased by increasing the amount of current sunk by the output driver. The second set of current control bits CCB are set to increase the current sunk by the output driver such that the output voltage becomes equal to the desired voltage level when the midpoint voltage between output voltage for the "01" and "11" is equal to $V_{REFM}$.

Finally, the third set of current control bits CCC is adjusted such that the midpoint voltage between output voltage for the "11" and "10" is equal to $V_{REFL}$.

Figure 19A:
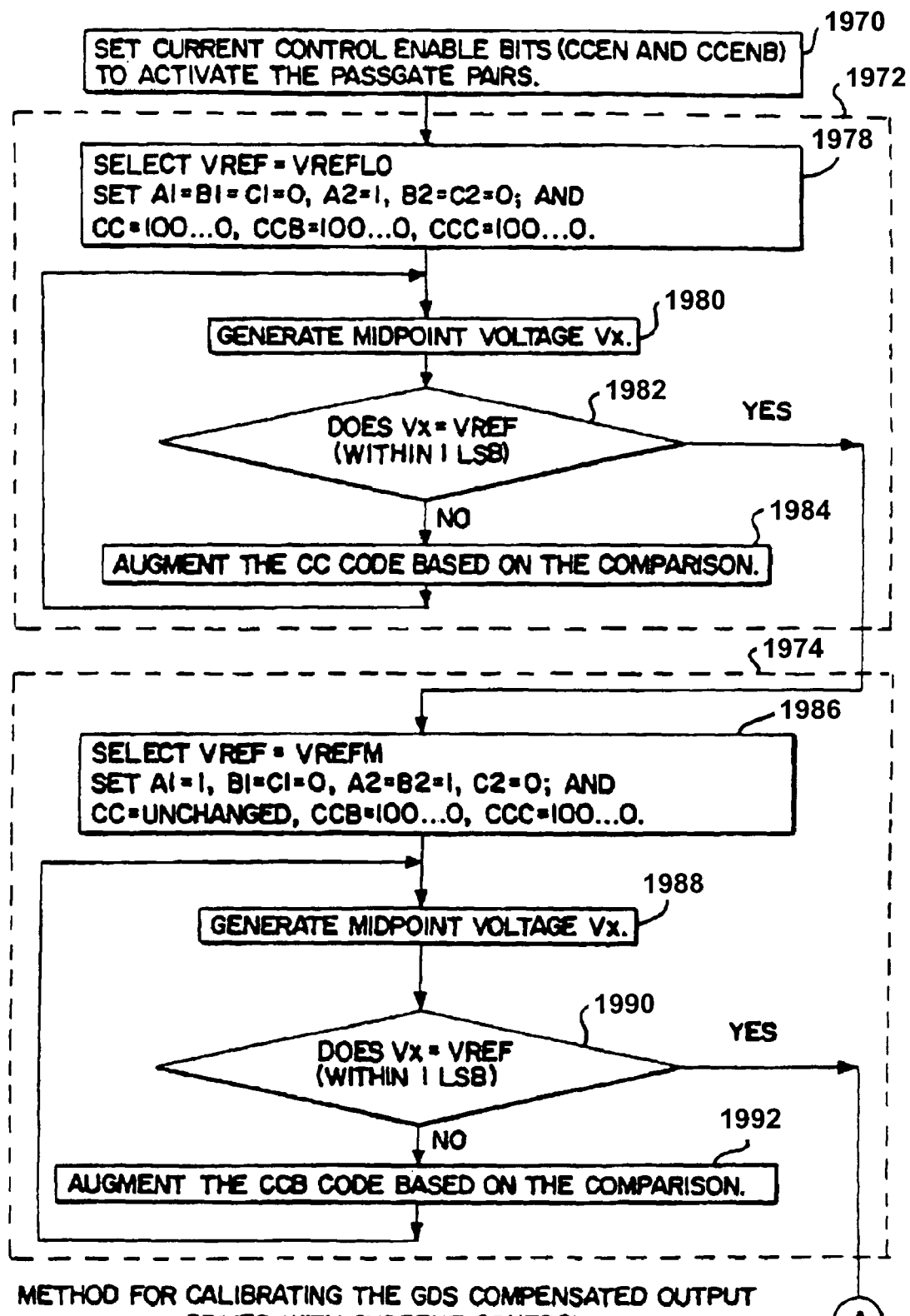
FIGS. 19A and 19B are a flowchart of a method for calibrating the current control circuitry using the setup of FIG. 18 for the output driver shown in FIG. 17.
Figure 19B:
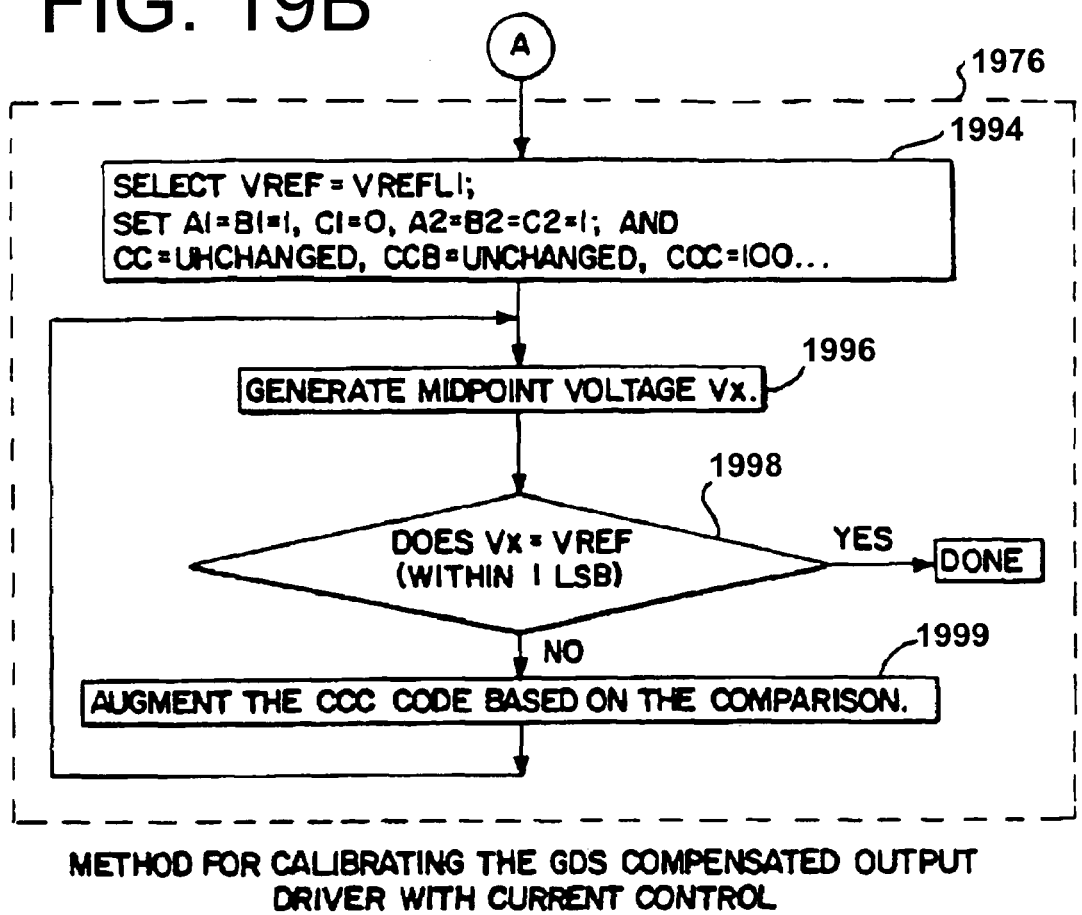

Referring to FIGS. 18, 19A, and 19B, the operation of the circuit 1850 including the state machine 1864 will be described. The flowchart of FIGS. 19A and 19B uses gray coded output voltages. In step 1970, the current control enable signal (ccen) and its complement (ccenb) are set to activate the passgate pairs 1860 and 1862 and output the midpoint voltage $V_X$, described above.

Three major blocks of steps 1972, 1974 and 1976 set the current control bits, CC, CCB and CCC, respectively.

In block 1972, step 1978 sets the initial conditions for determining the settings for the first set of current control bits CC. The state machine 1864 outputs the select reference voltage signal (SelRef) which causes the multiplexer 1854 to output the reference voltage $V_{REFHI}$ to the comparator 1854. A "00" symbol is supplied to output driver 1 1856 by outputting multi-PAM bit selection signals A1, B1 and C1 with values of zero. A "01" symbol is supplied to output driver 2 1858 by outputting multi-PAM bit selection signals A2 with a value of one, and B2 and C2 with a value of zero. The initial state of the first, second and third current control bits is as follows:

CC={1 0 0 . . . 0};

CCB={1 0 0 . . . 0};and ti CCC={1 0 0 . . . 0}.

The current control bits are initially set such that the stacked transistor pair sinking the most current will be activated.

In step 1980, the output drivers 1 and 2 output the voltages corresponding to the symbols "00" (the $V_{TERM}$ reference) and "01" (the drive level under calibration) and the midpoint voltage $V_X$ is generated. In step 1982, the comparator 1854 compares the midpoint voltage $V_X$ to the selected reference voltage $V_{REFHI}$. When the midpoint voltage is within one least significant bit of the reference voltage $V_{REFHI}$, the first set of current control bits have the proper setting. The state machine 1864 determines that the midpoint voltage $V_X$ is within one least significant bit of the reference voltage $V_{REFHI}$ when the current control bits begin to dither between two settings. In other words, the output of the comparator will alternate between a zero and a one.

In step 1984, when the midpoint voltage $V_X$ is not within one least significant bit of the reference voltage $V_{REFHI}$, the state machine 1864 augments the first set of current control bits depending on the result of the comparison. The term "augment" is used to indicate either incrementing or decrementing the current control bits. The process proceeds to step 1980.

If, in step 1982, the state machine 1864 determines that the midpoint voltage $V_X$ is within one least significant bit of the reference voltage, the process proceeds to step 1986 to calibrate the second set of current control bits, CCB.

In step 1986, the initial conditions for calibrating the second set of current control bits CCB are set. The state machine 1864 outputs the select reference voltage signal (SelRef) which causes the multiplexer 1854 to output the reference voltage $V_{REFM}$ to the comparator 1854. A "01" symbol is supplied to output driver 1 1856 by outputting multi-PAM bit selection signals A1 with a value of one, and B1 and C1 with values of zero. A "11" symbol is supplied to output driver 2 1858 by outputting multi-PAM bit selection signals A2 and B2 with a value of one, and C2 with a value of zero. The state of the first set of current control signals CC remains unchanged. The initial state of the second and third sets of current control bits, CCB and CCC, respectively, is as follows:

CCB={1 0 0 . . . 0};

CCC={1 0 0 . . . 0}.

In step 1988, the output drivers 1 1856 and 2 1858 output the voltages corresponding to the symbols "01" (the level calibrated in step 1072) and "11" (the level now under calibration), and the passgate pairs 1860 and 1862 output the midpoint voltage $V_X$. In step 1990, the comparator 1854 compares the midpoint voltage $V_X$ to the selected reference voltage $V_{REFM}$. When the midpoint voltage is not within one least significant bit of the reference voltage $V_{REFM}$, as described above with respect to $V_{REFHI}$, in step 1992, the state machine 1864 augments the second set of current control bits CCB by one and the process repeats at step 1986.

When the midpoint voltage is within one least significant bit of the reference voltage $V_{REFM}$, as described above with respect to $V_{REFHI}$, the second set of current control bits CCB have the proper setting and the process proceeds to step 1994 to calibrate the third set of current control bits, CCC.

In step 1994, the initial conditions for calibrating the third set of current control bits CCC are set. The state machine 1864 outputs the select reference voltage signal (SelRef), which causes the multiplexer 1854 to output the reference voltage $V_{REFLO}$ to comparator 1854. A "11" symbol (calibrated in step 1074) is supplied to output driver 1 1856 by outputting multi-PAM bit selection signals A1 and B1 with a value of one, and C1 with a value of zero. A "10" symbol (the level now under calibration) is supplied to output driver 2 1858 by outputting multi-PAM bit selection signals A2, B2 and C2 with a value of one. The state of the first and second sets of current control signals CC and CCB, respectively, remains unchanged. The initial state of the third set of current control bits CCC is as follows:

CCC={1 0 0 . . . 0}.

In step 1996, the output drivers 1 1856 and 2 1858 output the voltages corresponding to the symbols "11" and "10" and the passgate pairs 1860 and 1862 output the midpoint voltage $V_X$. In step 1998, the comparator 1854 compares the midpoint voltage $V_X$ to the selected reference voltage $V_{REFLO}$. When the midpoint voltage is not within one least significant bit of the reference voltage $V_{REFLO}$, as described above with respect to $V_{REFHI}$, in step 1999, the state machine 1864 augments the third set of current control bits CCC by one and the process repeats at step 1994.

In step 1998, when the midpoint voltage is within one least significant bit of the reference voltage $V_{REFLO}$, the appropriate settings for the first, second and third sets of current control bits, CC, CCB and CCC respectively are determined and the calibration is complete.

For the foregoing embodiment, a sequential search is described: starting at an initial value and augmenting. It should be emphasized, however, that alternative search techniques known to those skilled in the art may be used. For example, without limiting the foregoing, successive approximation using a binary search may be used. As a further alternative, a direct flash conversion may be used. This alternative is less desirable, however, because it is hardware intensive.

While the invention has been described in connection with a number of preferred embodiments, the foregoing is not intended to limit the scope of the invention to a particular form, circuit arrangement, or semiconductor topology. To the contrary, the invention is intended to be defined by the appended claims and to include such alternatives, modifications and variations as may be apparent to those skilled in the art upon reading the foregoing detailed description.

We claim:

1. A system comprising:
   a. a multi-PAM output driver having a plurality of current-control ports;
   b. a current-calibration circuit coupled to each of the current-control ports, the current-calibration circuit including a first, second, and third reference-voltage nodes; and
   c. a multi-level voltage generator including:
      i. a voltage divider having first, second, third, and fourth resistors coupled in series to divide a reference voltage into a first multi-PAM reference voltage between the first and second resistors and coupled to the first reference-voltage node, a second multi-PAM reference voltage between the second and third resistors and coupled to the second reference-voltage node, and a third multi-PAM reference voltage between the third and fourth resistors and coupled to the third reference-voltage node; and
      ii. an active current source having a current-handling terminal and a current-control terminal, wherein the current-handling terminal is coupled between two of the first, second, third, and fourth resistors.

2. The system of claim 1, wherein each of the current-control ports receives at least one current-control bit generated by the current-calibration circuit.

3. The system of claim 1, wherein the first multi-PAM reference voltage between the first and second resistors is coupled to the first reference-voltage node via an amplifier.

4. The system of claim 1, wherein the active current source conducts an offset current, responsive to a current-control signal on the current-handling terminal, based on crosstalk settings.

5. The system of claim 4, wherein the output driver includes an output terminal coupled to a termination resistor of impedance $Z_O$, and wherein the offset current is proportional to a product of the impedance $Z_O$ and at least one of a crosstalk current, and an equalization current.

6. The system of claim 1, wherein the output driver is a four-PAM driver.

7. The system of claim 1, wherein the first reference-voltage node exhibits a high reference voltage $V_{REFHI}$, the second reference-voltage node exhibits a medium reference voltage $V_{REFM}$, and the third reference-voltage node exhibits a low reference voltage $V_{REFLO}$, and wherein the active current source is coupled to the first reference-voltage node to reduce the high reference voltage $V_{REFHI}$.

8. The system of claim 7, wherein the active current source reduces the high reference voltage $V_{REFHI}$ in response to at least one of an equalization current control signal and a crosstalk current control signal.

9. A current-calibration circuitry for a multi-PAM output driver, the current-calibration circuitry comprising:
   a. a current-calibration circuit including a first, second, and third reference-voltage nodes adapted to receive respective relatively high, medium, and low reference voltages; and
   b. a multi-level voltage generator adapted to produce the high, medium, and low reference voltages, the voltage generator including:
      i. first and second voltage supply pins providing a reference voltage;

ii. a voltage divider having first, second, and third multi-PAM reference terminals, the voltage divider dividing the reference voltage into a plurality of multi-PAM references, including a first multi-PAM reference voltage on the first multi-PAM reference terminal, a second multi-PAM reference voltage on the second multi-PAM reference terminal, and a third multi-PAM reference voltage on the third multi-PAM reference terminal; and iii. an active current source drawing current from the first multi-PAM reference terminal to reduce the first multi-PAM reference voltage.

10. The system of claim 9, wherein the active current source reduces the current is an offset current proportional to at least one of an equalization current and a crosstalk current.

11. The system of claim 9, wherein reducing the first multi-PAM reference voltage reduces at least one of the second and third multi-PAM reference voltages.

12. The system of claim 9, wherein the first multi-PAM references voltage is higher than the second and third multi-PAM reference voltages.

13. A method for calibrating a multi-PAM output driver adapted to cause an output signal to transition between a plurality of logic states, the method comprising:

a. dividing a reference voltage into a plurality of multi-PAM reference voltages on respective multi-PAM reference-voltage nodes; and b. shifting the logic states to allow equalization signals to overdrive transitions between the logic states, wherein shifting the logic states includes shifting the multi-PAM reference voltages by drawing an offset current from one of the multi-PAM reference-voltage nodes.

14. The method of claim 13, further comprising developing a current-control signal based upon an equalization coefficient for the output driver to define the offset current.

15. The method of claim 13, further comprising developing a current-control signal based upon a crosstalk coefficient for the output driver to define the offset current.

* * * * *